United States Patent
Kumagai et al.

(10) Patent No.: US 10,096,680 B2
(45) Date of Patent: Oct. 9, 2018

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Naoki Kumagai, Matsumoto (JP); Takashi Tsutsumi, Matsumoto (JP); Yoshiyuki Sakai, Matsumoto (JP); Yasuhiko Oonishi, Matsumoto (JP); Takumi Fujimoto, Matsumoto (JP); Kenji Fukuda, Tsukuba (JP); Shinsuke Harada, Tsukuba (JP); Mitsuo Okamoto, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/468,941

(22) Filed: Mar. 24, 2017

(65) Prior Publication Data
US 2017/0194438 A1 Jul. 6, 2017

Related U.S. Application Data

(63) Continuation of application No. PCT/JP2015/085166, filed on Dec. 16, 2015.

(30) Foreign Application Priority Data

Jan. 16, 2015 (JP) .................................. 2015-006394
Jan. 16, 2015 (JP) .................................. 2015-006395

(51) Int. Cl.
*H01L 29/16* (2006.01)
*H01L 29/66* (2006.01)
(Continued)

(52) U.S. Cl.
CPC ...... *H01L 29/1608* (2013.01); *H01L 29/0865* (2013.01); *H01L 29/1095* (2013.01);
(Continued)

(58) Field of Classification Search
CPC . H01L 29/1608; H01L 29/47; H01L 29/0865; H01L 29/1095; H01L 29/66068; H01L 20/45; H01L 20/7813
See application file for complete search history.

(56) References Cited

U.S. PATENT DOCUMENTS 5,912,497 A * 6/1999 Baliga ............... H01L 29/66333
257/139
6,815,303 B2 * 11/2004 Ahn .................. H01L 29/66287
257/E21.379
(Continued)

FOREIGN PATENT DOCUMENTS

JP 2006-73792 A 3/2006
JP 2009-194127 A 8/2009
(Continued)

OTHER PUBLICATIONS

Haruhisa Uchida and Eckehard Fromm. "Reaction Kinetics of Hydrogen and Oxygen Absorption of Titanium Films". Journal of Advanced Science, vol. 2, No. 3, Sep. 20, 1990, pp. 153-158.

*Primary Examiner* — William Coleman
(74) *Attorney, Agent, or Firm* — Rabin & Berdo, P.C.

(57) ABSTRACT

A silicon carbide semiconductor device, including a silicon carbide semiconductor structure, an insulated gate structure including a gate insulating film contacting the silicon carbide semiconductor structure and a gate electrode formed on the gate insulating film, an interlayer insulating film covering the insulated gate structure, a metal layer provided on the interlayer insulating film for absorbing or blocking hydrogen, and a main electrode provided on the metal layer and
(Continued)

electrically connected to the silicon carbide semiconductor structure.

18 Claims, 10 Drawing Sheets

(51) Int. Cl.
　　*H01L 29/78* (2006.01)
　　*H01L 29/08* (2006.01)
　　*H01L 29/10* (2006.01)
　　*H01L 29/45* (2006.01)
　　*H01L 29/47* (2006.01)
(52) U.S. Cl.
　　CPC .............. *H01L 29/45* (2013.01); *H01L 29/47* (2013.01); *H01L 29/66068* (2013.01); *H01L 29/7813* (2013.01)

(56) References Cited

U.S. PATENT DOCUMENTS

| 2011/0207321 | A1 | 8/2011 | Fujiwara et al. |
| 2012/0132912 | A1 | 5/2012 | Suekawa et al. |
| 2013/0075756 | A1* | 3/2013 | Arthur .................. H01L 21/045 257/77 |
| 2016/0027891 | A1 | 1/2016 | Yamada et al. |

FOREIGN PATENT DOCUMENTS

| JP | 2010-129707 A | 6/2010 |
| JP | 2011-171551 A | 9/2011 |
| JP | 2012-129503 A | 7/2012 |
| JP | 2013-232560 A | 11/2013 |
| JP | 2014-187128 A | 10/2014 |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This is a continuation application of International Application PCT/JP2015/085166 filed on Dec. 16, 2015, which claims priority from Japanese Patent Application Nos. 2015-006394 and 2015-006395, both filed on Jan. 16, 2015, the contents of which are incorporated herein by reference.

BACKGROUND OF THE INVENTION

1. Field of the Invention

Embodiments of the present invention relate to a silicon carbide semiconductor device and a method of manufacturing a silicon carbide semiconductor device.

2. Description of the Related Art

Wide bandgap semiconductors (semiconductors having a wider bandgap than a silicon (Si) semiconductor) such as silicon carbide (SiC) and gallium nitride (GaN), diamond and the like have favorable properties including a higher critical field strength and a higher thermal conductivity than a silicon semiconductor and thus, application of wide bandgap semiconductors is particularly expected in power devices. Among these semiconductors, silicon carbide semiconductors enable the ON resistance, which is inversely proportional to critical field strength, to be reduced to a greater extent as compared to a silicon semiconductor and therefore, have gained attention recently as an optimal semiconductor for low loss power devices. Further, similar to silicon semiconductors, silicon carbide semiconductors enable formation of an oxide film ($SiO_2$ film) on a silicon carbide semiconductor substrate (a semiconductor substrate that uses a silicon carbide semiconductor) by thermal oxidation.

Therefore, development of SiC-power metal oxide semiconductor field effect transistors (MOSFETs) that have a low ON resistance and fast switching speed and that use an oxide film formed by thermal oxidation as a gate insulating film is advancing. Nonetheless, when a gate insulating film is formed on a surface of a silicon carbide semiconductor base (semiconductor chip) by thermal oxidation, many defects (interface state) are formed near a junction interface (hereinafter, $SiO_2$/SiC interface) of the gate insulating film and a silicon carbide semiconductor portion, and the interface state density (Dit) becomes high. Therefore, problems arise in that channel mobility decreases, ON resistance increases, and conduction loss increases.

As a method of solving these problems, a method of reducing the interface state density of the $SiO_2$/SiC interface by forming an oxide film on a silicon carbide semiconductor substrate by thermal oxidation in an atmosphere that includes nitrous oxide ($N_2O$) or nitric oxide (NO) has been proposed. The oxide film to become a gate insulating film is formed by thermal oxidation in an atmosphere that includes nitrous oxide or nitric oxide whereby the interface state density of the $SiO_2$/SiC interface may be made to be $2\times10^{12}$ $cm^{-2}$ $eV^{-1}$ or less to realize high channel mobility. Therefore, in a SiC-MOSFET, formation of a metal oxide semiconductor (MOS) gate structure that has a good-quality oxide film as a gate insulating film becomes possible.

A conventional structure of a semiconductor device that uses a silicon carbide semiconductor (hereafter, silicon carbide semiconductor device) will be described taking a SiC-vertical MOSFET of a planar gate structure as an example. FIGS. 8 and 12 are cross-sectional views of a structure of a conventional silicon carbide semiconductor device. In a conventional silicon carbide semiconductor device depicted in FIGS. 8 and 12, on a front surface of an $n^+$-type silicon carbide substrate 101 becoming an $n^+$-type drain region, an $n^-$-type silicon carbide epitaxial layer becoming an $n^-$-type drift layer 102, and a $p^-$-type epitaxial semiconductor layer becoming a $p^-$-type well layer 104 are sequentially deposited. Hereinafter, a stacked base constituted by the $n^-$-type drift layer 102 and the $p^-$-type well layer 104 sequentially stacked on the $n^+$-type silicon carbide substrate 101 is regarded as a silicon carbide semiconductor base.

On a front surface side (the surface on the $p^-$-type well layer 104 side) of the silicon carbide semiconductor base, a MOS gate structure constituted by a p-type semiconductor region 103, a $p^-$-type well layer 104, a $p^+$-type contact region 105, an $n^+$-type source region 106, a gate insulating film 108, and a gate electrode 109 is provided. The p-type semiconductor region 103 and the $p^-$-type well layer 104 function as a base region. An interlayer insulating film 110 is provided so as to cover the gate electrode 109. A front silicide layer 112 forms an ohmic contact (electrical contact portion) with a silicon carbide semiconductor portion in a contact hole that penetrates the interlayer insulating film 110 in a depth direction.

The front silicide layer 112 is, for example, a nickel silicide (NiSi) layer. On the interlayer insulating film 110 and the front silicide layer 112, a source electrode 114 is provided. The source electrode 114 is electrically connected to the $p^+$-type contact region 105 and the $n^+$-type source region 106 by the front silicide layer 112, and is electrically insulated from the gate electrode 109 by the interlayer insulating film 110. As depicted in FIG. 8, a titanium nitride (TiN) film 111 may be provided between the interlayer insulating film 110 and the source electrode 114. The titanium nitride film 111 is electrically insulated from the gate electrode 109 by the interlayer insulating film 110.

A rear surface silicide layer 113 is provided on an entire rear surface of the silicon carbide semiconductor base (a surface on an $n^+$-type silicon carbide substrate 101 side, i.e., a rear surface of the $n^+$-type silicon carbide substrate 101) (not depicted in FIG. 12), and a rear electrode 115 to become a drain electrode is provided on the rear surface silicide layer 113. Reference numeral 107 is an $n^-$-type junction field effect transistor (JFET) region provided at a portion of the $n^-$-type drift layer 102 directly beneath the gate electrode 109 (portion facing the gate electrode 109 via the gate insulating film 108) and between the $p^-$-type well layer 104 and an adjacent $p^-$-type well layer 104. Reference numeral 116 in FIG. 12 is a passivation protective film.

A conventional method of manufacturing a silicon carbide semiconductor device will be described with reference to FIG. 8. First, on the front surface of the $n^+$-type silicon carbide substrate 101 becoming the $n^+$-type drain region, the $n^-$-type drift layer 102 doped with $5\times10^{15}/cm^3$ to $1\times10^{16}/cm^3$ of nitrogen (N) is deposited (formed) by epitaxial growth to have a thickness of 10 μm. Next, the p-type semiconductor region 103 is selectively formed in the surface layer of the $n^-$-type drift layer 102 by ion implantation of a p-type impurity. On the $n^-$-type drift layer 102, the $p^-$-type well layer 104 doped with $5\times10^{15}/cm^3$ of aluminum (Al) is deposited by epitaxial growth so as to cover the p-type semiconductor region 103 and to have a thickness of 0.5 μm.

In the p⁻-type well layer 104, the JFET region 107 is selectively formed by ion implantation of nitrogen so as to penetrate the p⁻-type well layer 104 in the depth direction (base-depth direction) and reach the n⁻-type drift layer 102. Next, in the p⁻-type well layer 104, the n⁺-type source region 106 is selectively formed away from the JFET region 107 by ion implantation of phosphorus (P). Further, in the p⁻-type well layer 104, the p⁺-type contact region 105 contacting the n⁺-type source region 106 is selectively formed by ion implantation of aluminum. Next, activation annealing (heat treatment) is performed at a temperature of 1600 degrees C. in an argon (Ar) atmosphere.

Next, on the surface of a portion of the p⁻-type well layer 104 between the JFET region 107 and the n⁺-type source region 106, the gate insulating film 108 is formed to have a thickness of 70 nm by thermal oxidation in a nitrous oxide atmosphere. On the gate insulating film 108, poly-silicon (poly-Si) layer becoming the gate electrode 109 is formed. Next, on the entire front surface of the silicon carbide semiconductor base, the interlayer insulating film 110 is formed so as to cover the gate electrode 109. Next, a contact hole penetrating the interlayer insulating film 110 in the depth direction is formed by photolithography and etching to expose the p⁺-type contact region 105 and the n⁺-type source region 106 in the contact hole.

Next, on the entire front surface of the silicon carbide semiconductor base, the titanium nitride film 111 is formed so as to cover the interlayer insulating film 110. Next, a portion of the titanium nitride film 111 covering the p⁺-type contact region 105 and the n⁺-type source region 106 in the contact hole is removed by photolithography and etching to again expose the p⁺-type contact region 105 and the n⁺-type source region 106 in the contact hole. Next, on the silicon carbide semiconductor portion exposed in the contact hole a nickel (Ni) film is formed and on the rear surface of the silicon carbide semiconductor base, a nickel film and a titanium (Ti) film are sequentially deposited (formed).

Next, the front silicide layer 112 and the rear surface silicide layer 113 are respectively formed on the surfaces of the base by sintering (heat treatment). Next, on the interlayer insulating film 110 and the front silicide layer 112, an aluminum layer becoming the source electrode 114 is deposited to have a thickness of 5.0 µm. On the source electrode 114, a polyimide layer to become the non-depicted passivation protective film is formed, and the passivation protective film is hardened (cured) by heat treatment at a temperature of 380 degrees C. Thereafter, on the rear surface silicide layer 113, the rear electrode 115 is formed whereby the SiC-vertical MOSFET depicted in FIG. 8 is completed.

When another SiC-vertical MOSFET depicted in FIG. 12 is formed, after the contact hole is formed, the step of forming the titanium nitride film 111 is omitted and the nickel layer becoming the front silicide layer 112 is formed in the contact hole.

As another SiC-vertical MOSFET, the following device has been proposed. A silicide layer is formed on a source region and a contact region in a DMOSFET region. A metal layer constituting a Schottky electrode is formed on a drift-epi layer and a well region in a SBD region. The metal layer extends from the Schottky electrode and contacts the silicide layer, and is formed from a material selected from a group including titanium, tantalum (Ta), and the nitrides thereof. Further, it has been disclosed that it does not matter even if at least a portion of the metal layer has been removed on interlayer insulating film (for example, refer to Japanese Laid-Open Patent Publication No. 2009-194127 (paragraph 0066, FIG. 1, and Abstract)).

Further, as another SiC-vertical MOSFET, a device has been proposed that includes a poly-silicon gate electrode provided on a semiconductor layer and a source region that is an impurity region formed on the semiconductor layer. The top of the gate electrode is covered by an interlayer insulating film and an aluminum source electrode extends on the interlayer insulating film. An aluminum gate pad is connected to the gate electrode. A barrier metal layer that suppresses the diffusion of aluminum is arranged between the source electrode and the interlayer insulating film; and between the gate pad and the gate electrode. The barrier metal layer is formed from titanium (Ti) or titanium nitride (TiN), or titanium silicon (TiSi) (for example, refer to Japanese Laid-Open Patent Publication No. 2012-129503).

SUMMARY OF THE INVENTION

According to one aspect of the present invention, a silicon carbide semiconductor device includes an insulated gate structure including, as a gate insulating film, a silicon dioxide film contacting a silicon carbide semiconductor portion; an interlayer insulating film covering the insulated gate structure; a first metal layer provided on a surface of the interlayer insulating film, the first metal layer absorbing or blocking hydrogen; and a first main electrode provided on a surface of the first metal layer, the first main electrode being electrically connected to the silicon carbide semiconductor portion.

In the silicon carbide semiconductor device, the first metal layer is a titanium film.

In the silicon carbide semiconductor device, the first metal layer covers the surface of the interlayer insulating film completely.

In the silicon carbide semiconductor device, the interlayer insulating film covers the insulated gate structure and contacts the gate insulating film.

In the silicon carbide semiconductor device, the first main electrode is provided to be free of direct contact with the interlayer insulating film and the gate insulating film.

In the silicon carbide semiconductor device, the first metal layer has a thickness of 10 nm to 1.0 µm.

In the silicon carbide semiconductor device, the first metal layer has a thickness of 80 nm to 150 nm.

In the silicon carbide semiconductor device, the first metal layer has an absorbed hydrogen molecule concentration of $1 \times 10^{16}/cm^2$ or higher.

In the silicon carbide semiconductor device, a second metal layer provided between the first metal layer and the first main electrode, the second metal layer being chemically stable with respect to the first metal layer.

In the silicon carbide semiconductor device, the second metal layer is a titanium nitride film.

In the silicon carbide semiconductor device, a third metal layer provided between the second metal layer and the first main electrode, the third metal layer absorbing or blocking the hydrogen.

In the silicon carbide semiconductor device, the third metal layer is a titanium film.

In the silicon carbide semiconductor device, an alloy film provided between the first metal layer and the first main electrode, the alloy film containing titanium and aluminum.

In the silicon carbide semiconductor device, an alloy film is provided between the third metal layer and the first main electrode, the alloy film containing titanium and aluminum.

In the silicon carbide semiconductor device, the alloy film has a thickness of 10 nm to 50 nm.

The silicon carbide semiconductor device includes a semiconductor substrate including a silicon carbide semiconductor; an n-type drift layer provided on a first main surface of the semiconductor substrate, the n-type drift layer including the silicon carbide semiconductor; a p-type semiconductor region selectively provided on an opposite side of the n-type drift layer from a semiconductor substrate side, the p-type semiconductor region constituting the silicon carbide semiconductor portion; an n-type semiconductor region selectively provided in the p-type semiconductor region, the n-type semiconductor region constituting the silicon carbide semiconductor portion; the gate insulating film provided on a surface of a portion of the p-type semiconductor region between the n-type drift layer and the n-type semiconductor region; a gate electrode provided on the gate insulating film, the gate electrode constituting the insulated gate structure; the first main electrode electrically connected to the n-type semiconductor region; and a second main electrode provided on a second main surface of the semiconductor substrate.

In the silicon carbide semiconductor device, the semiconductor substrate is an n-type and has an impurity concentration that is higher than that of the n-type drift layer.

According to another aspect of the present invention, a method of manufacturing a silicon carbide semiconductor device includes thermally oxidizing a silicon carbide semiconductor portion to form a silicon dioxide film on a surface of the silicon carbide semiconductor portion; forming an insulated gate structure including the silicon dioxide film as a gate insulating film; forming an interlayer insulating film covering the insulated gate structure; forming a titanium film on the interlayer insulating film; and forming a first main electrode on the titanium film so as to be electrically connected to the silicon carbide semiconductor portion.

In the method of manufacturing a silicon carbide semiconductor device, heat treating at a temperature of 450 degrees C. or less after forming the first main electrode.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
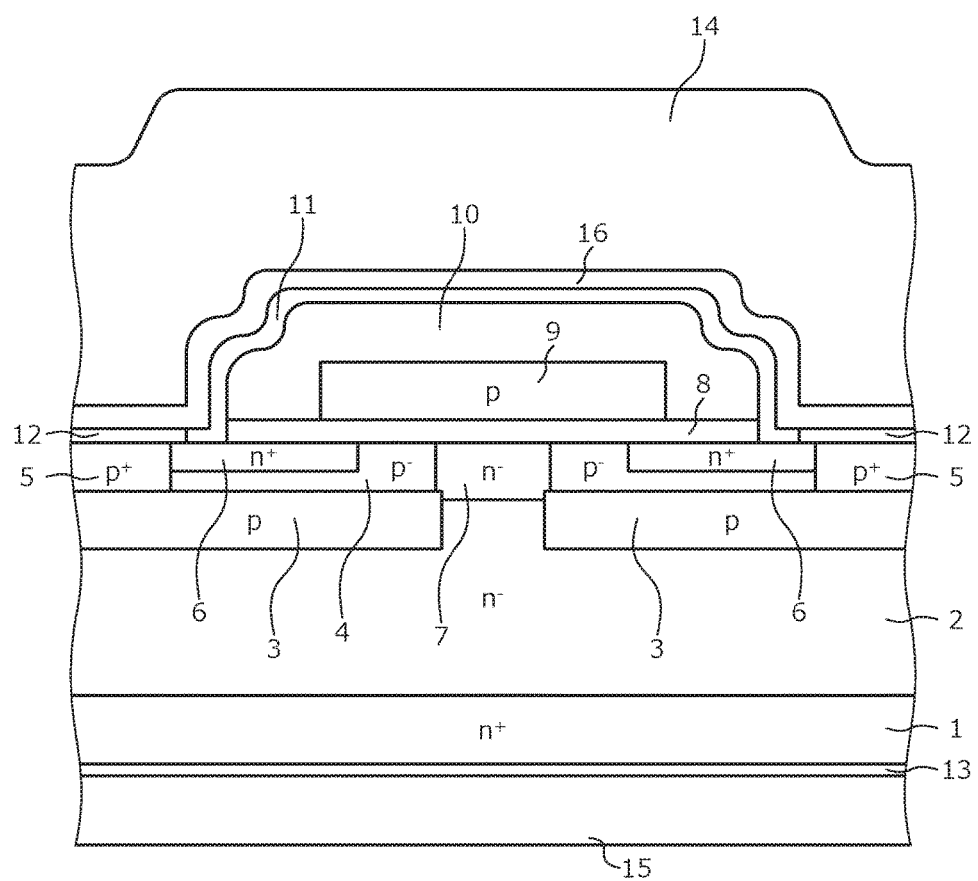
FIG. 1 is a cross-sectional view of a structure of a silicon carbide semiconductor device according to the first embodiment.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A structure of the silicon carbide semiconductor device according to the first embodiment will be described taking a SiC-vertical MOSFET having a planar gate structure as an example. FIG. 1 is a cross-sectional view of a structure of the silicon carbide semiconductor device according to the first embodiment. In FIG. 1, a single unit cell (functional unit of an element) of an active region responsible for current driving (a region through which current flows in an ON state) is depicted, other unit cells repeatedly arranged to be adjacent to this unit cell and an edge termination structure portion surrounding the active region are not depicted (similarly in FIGS. 2, 3, and 9 to 11). The edge termination structure portion is a region that mitigates the electric field on a base front surface side of an n$^-$-type drift layer 2 and sustains the breakdown voltage, for example, the edge termination structure portion has a breakdown voltage structure combining a guard ring, a field plate, a RESURF, and the like.

In the silicon carbide semiconductor device depicted in FIG. 1, on a front surface of an n$^+$-type silicon carbide substrate 1 becoming an n$^+$-type drain region, an n$^-$-type silicon carbide epitaxial layer to become an n$^-$-type drift layer 2 is deposited. In a surface layer on the opposite side of the n$^-$-type drift layer 2 from the n$^+$-type silicon carbide substrate 1 side, a p-type semiconductor region 3 is selectively provided. On the surface of the opposite side of the n$^-$-type drift layer 2 from the n$^+$-type silicon carbide substrate 1 side, a p$^-$-type silicon carbide epitaxial layer to become a p$^-$-type well layer 4 is deposited so as to cover the p-type semiconductor region 3. The p-type semiconductor region 3 and the p$^-$-type well layer 4 function as a base region (p-type semiconductor region).

An impurity concentration of the p-type semiconductor region 3, for example, may be higher than an impurity concentration of the p$^-$-type well layer 4. As a result, at a pn junction between the p-type semiconductor region 3 and the n$^-$-type drift layer 2, when a high reverse bias is applied, punch-through of the p⁻-type well layer 4 may be prevented. In the p⁻-type well layer 4, an n⁻-type region (JFET region) 7 is selectively provided to penetrate the p⁻-type well layer 4 in a depth direction and reach the n⁻-type drift layer 2. In other words, the JFET region 7 is provided on a surface of a portion of the n⁻-type drift layer 2 between adjacent p-type semiconductor regions 3 and functions as a drift region together with the n⁻-type drift layer 2. An impurity concentration of the JFET region 7 may be higher than, for example, an impurity concentration of the n⁻-type drift layer 2 to thereby reduce the JFET resistance.

In a portion of the p⁻-type well layer 4 on the p-type semiconductor region 3, a p⁺-type contact region 5 and an n⁺-type source region (n-type semiconductor region) 6 are each selectively provided. The p⁺-type contact region 5 is provided so as to contact the n⁺-type source region 6, for example, on the opposite side from the JFET region 7 side. Further, the p⁺-type contact region 5 may be provided to penetrate the p⁻-type well layer 4 and reach the p-type semiconductor region 3. On the surface of a portion of the p⁻-type well layer 4 between the JFET region 7 and the n⁺-type source region 6, a gate electrode 9 is provided to extend onto the JFET region 7 and onto the n⁺-type source region 6, via a gate insulating film 8.

The gate insulating film 8 is a silicon dioxide ($SiO_2$) film formed by thermal oxidation of the front surface (surface on the p⁻-type well layer 4 side) of a silicon carbide semiconductor base (stacked base constituted by the n⁺-type silicon carbide substrate 1, the n⁻-type drift layer 2, and the p⁻-type well layer 4 sequentially stacked). In this manner, a MOS gate structure including the silicon carbide semiconductor portion (i.e., the silicon carbide semiconductor structure, including the semiconductor regions such as the p⁻-type well layer 4, the n⁺-type source region 6, etc.), the gate insulating film 8, and the gate electrode 9 is provided on the front surface side of the silicon carbide semiconductor base (semiconductor chip). An interlayer insulating film 10 is provided so as to cover the gate electrode 9 and contact the gate insulating film 8. A contact hole is provided that penetrates the interlayer insulating film 10 in the depth direction and reaches the p⁺-type contact region 5 and the n⁺-type source region 6. On the silicon carbide semiconductor portion exposed in the contact hole, a front silicide layer 12 is provided that forms an ohmic contact with the silicon carbide semiconductor portion. The front silicide layer 12, for example, may be a nickel silicide (NiSi) layer.

On the interlayer insulating film 10, a metal layer (hereinafter, titanium nitride film) 11 having titanium nitride (TiN) as a main component is provided. The titanium nitride film 11 is electrically insulated from the gate electrode 9 by the interlayer insulating film 10 and functions as source wiring together with a source electrode 14. Further, the titanium nitride film 11 has a function of preventing nickel atoms in a nickel (Ni) film formed in the contact hole from diffusing into the interlayer insulating film 10 when the front silicide layer 12 is formed. Preventing the diffusion of the nickel atoms into the interlayer insulating film 10 enables short-circuiting of the gate electrode 9 and the source electrode 14 described hereinafter to be prevented. An end of the titanium nitride film 11 extends onto, for example, the n⁺-type source region 6 exposed in the contact hole and is connected to the front silicide layer 12 in the contact hole.

On the surface of the titanium nitride film 11 and the front silicide layer 12, a metal layer (hereinafter, titanium film) 16 having titanium (Ti) as a main component is provided. The titanium film 16 covers the interlayer insulating film 10 (when the gate insulating film 8 is exposed in the contact hole, covers the gate insulating film 8 and the interlayer insulating film 10), via the titanium nitride film 11. Further, the titanium film 16 functions as source wiring together with the source electrode 14 that is described hereinafter and has aluminum (Al) as a main component. The titanium film 16 has a function of absorbing and blocking hydrogen (H) atoms/hydrogen ions generated from the source electrode 14 from reaching the interlayer insulating film 10 below. The hydrogen atoms/hydrogen ions are particles having a hydrogen atom as a smallest constituent unit and in particular, are hydrogen atoms, hydrogen ions, and hydrogen molecules.

By providing the titanium film 16 between the interlayer insulating film 10 and the source electrode 14, hydrogen atoms/hydrogen ions generated from the source electrode 14 are absorbed and blocked by the titanium film 16. Therefore, hydrogen atoms/hydrogen ions generated from the source electrode 14 may be prevented from moving through the interlayer insulating film 10, into an interface of the gate insulating film 8 and the silicon carbide semiconductor portion (hereinafter, $SiO_2$/SiC interface) or the gate insulating film 8. Thus, positive charge generated by hydrogen atoms/hydrogen ions may be suppressed.

The titanium film 16 may have a thickness of about, for example, 10 nm or more and 1.0 μm or less. The reason for this is as follows. By making the titanium film 16 have a thickness of 10 nm or greater, the absorption effect of the hydrogen atoms/hydrogen ions by the titanium film 16 is obtained. The concentration of hydrogen molecules ($H_2$) absorbed by the titanium film 16 is, for example, $1 \times 10^{16}$/$cm^2$ or higher. Further, since titanium is a hard metal, when the titanium film 16 has a thickness greater than 1.0 μm, cracks occur in the titanium film 16. More specifically, the titanium film 16 may have a thickness of about, for example, 80 nm or more and 150 nm or less. The reason for this is that a decrease of absorption/blocking effect of the titanium film 16 consequent to step coverage defects of the titanium film 16 and cracks occurring in the titanium film 16 may be prevented.

On the surface of the titanium film 16, a source electrode (first main electrode) 14 having aluminum as a main component is provided so as to be embedded in the contact hole. The source electrode 14 is electrically connected to the p⁺-type contact region 5 and the n⁺-type source region 6, via the titanium film 16 and the front silicide layer 12. The source electrode 14 functions as source wiring. By providing the titanium film 16 beneath the source electrode 14, the source electrode 14 and the interlayer insulating film 10 do not contact each other. On the source electrode 14, a passivation protective film (not depicted) protecting a chip front surface is provided. On the entire surface on the rear surface on the silicon carbide semiconductor base (n⁺-type silicon carbide substrate 1 side, i.e., the rear surface of the n⁺-type silicon carbide substrate 1), a rear surface silicide layer 13 forming an ohmic contact with the n⁺-type silicon carbide substrate 1 is formed. On the surface of the rear surface silicide layer 13, a rear electrode 15 to become a drain electrode (second main electrode) is provided.

The method of manufacturing a silicon carbide semiconductor device according to the first embodiment will be described. First, on the front surface of the n⁺-type silicon carbide substrate (semiconductor wafer) 1 becoming the n⁺-type drain region, the n⁻-type drift layer 2 doped with, for example, $1 \times 10^{16}$/$cm^3$ of an n-type impurity such as nitrogen (N) is formed by epitaxial growth and deposited (formed) to have a thickness of about, for example, 10 μm. Next, in a surface layer of the n⁻-type drift layer 2, the p-type semiconductor region 3 is selectively formed by ion implantation of a p-type impurity. On the n⁻-type drift layer 2, the p⁻-type well layer 4 doped with, for example, 5×10¹⁵/cm³ of a p-type impurity such as aluminum (Al) is formed by epitaxial growth so as to cover the p-type semiconductor region 3 and is deposited to have a thickness of about, for example, 0.5 µm. By the processes up to here, the silicon carbide semiconductor base (epitaxial wafer) constituted by the n⁺-type silicon carbide substrate 1, the n⁻-type drift layer 2, and the p⁻-type well layer 4 sequentially stacked is formed.

Next, for example, in the p⁻-type well layer 4, the JFET region 7 is selectively formed by ion implantation of an n-type impurity such as nitrogen so as to penetrate the p⁻-type well layer 4 in the depth direction (base depth direction) and reach the n⁻-type drift layer 2. Next, for example, in the p⁻-type well layer 4, the n⁺-type source region 6 is selectively formed by ion implantation of an n-type impurity such as phosphorus (P) so as to be away from the JFET region 7. Further, for example, in the p⁻-type well layer 4, for example, the p⁺-type contact region 5 is selectively formed by ion implantation of a p-type impurity such as aluminum so as to contact the n⁺-type source region 6. Next, for example, activation annealing (heat treatment) is performed at a temperature of 1600 degrees C. in an argon (Ar) atmosphere.

Next, for example, on the surface of a portion of the p⁻-type well layer 4 between the n⁺-type source region 6 and the JFET region 7, the gate insulating film 8 is formed by thermal oxidation in a nitrous oxide (N₂O) atmosphere to have a thickness of about, for example, 70 nm. Next, on the gate insulating film 8, a poly-silicon (poly-Si) layer to become the gate electrode 9 is formed. Next, on the entire front surface (surface on the p⁻-type well layer 4 side) of the silicon carbide semiconductor base, the interlayer insulating film 10 is formed so as to cover the gate electrode 9. Next, the contact hole is formed by photolithography and etching to penetrate the interlayer insulating film 10 in the depth direction whereby the p⁺-type contact region 5 and the n⁺-type source region 6 are exposed in contact hole.

Next, on the entire front surface of the silicon carbide semiconductor base, the titanium nitride film 11 is formed so as to cover the interlayer insulating film 10. Formation of the titanium nitride film 11 may be omitted when there is no risk of nickel atoms in the nickel film formed on the base front surface diffusing into the interlayer insulating film 10 when the nickel silicide layer becoming the front silicide layer 12 described hereinafter is formed. In particular, when the nickel film is formed on only the p⁺-type contact region 5 and the n⁺-type source region 6 in the contact hole (i.e., the nickel film is formed so as to not contact the interlayer insulating film 10), nickel atoms in the nickel film do not diffuse into the interlayer insulating film 10 and therefore, the titanium nitride film 11 need not be formed.

Next, the portion of the titanium nitride film 11 covering the p⁺-type contact region 5 and the n⁺-type source region 6 in the contact hole is removed by photolithography and etching to again expose the p⁺-type contact region 5 and the n⁺-type source region 6 in the contact hole. Next, the nickel film is formed on the front surface of the silicon carbide semiconductor base and on the entire rear surface of the silicon carbide semiconductor base, the nickel film, and the titanium film sequentially stacked (formed). The nickel film formed on the front surface of the silicon carbide semiconductor base may be formed only on the silicon carbide semiconductor portion exposed in the contact hole. Next, the silicon carbide semiconductor portion and the nickel film are caused to react by sintering (heat treatment) and the front silicide layer 12 and the rear surface silicide layer 13 are respectively formed on surfaces of the base.

Next, for example, the titanium film 16 is formed on the entire front surface of the silicon carbide semiconductor base (i.e., on the titanium nitride film 11 and the front silicide layer 12) by a sputtering method. Next, for example, a metal layer (hereinafter, aluminum layer) having aluminum as a main component and becoming the source electrode 14 is formed on the titanium film 16 by a sputtering method and deposited to have a thickness of 5.0 µm. Next, the polyimide layer becoming the passivation protective film (not depicted) is formed on the source electrode 14 and, for example, the passivation protective film is hardened (cured) by heat treatment at a temperature of about 380 degrees. Next, the rear electrode 15 is formed on the rear surface silicide layer 13. Thereafter, silicon carbide semiconductor base is cut (diced) into individual chips whereby the SiC-vertical MOSFET depicted in FIG. 1 is completed.

As described, according to the first embodiment, by providing the titanium film between the source electrode and the interlayer insulating film so as to cover interlayer insulating film, the source electrode and the interlayer insulating film do not contact each other. Therefore, under high-temperature operation, hydrogen atoms/hydrogen ions generated from inside the source electrode are absorbed/blocked by the titanium film beneath the source electrode. As a result, the hydrogen atoms/hydrogen ions generated from inside the source electrode are prevented from diffusing into the interlayer insulating film and from diffusing into the gate insulating film contacting the interlayer insulating film. Therefore, near the interface of the gate insulating film and the silicon carbide semiconductor portion or inside the gate insulating film, the generation of positive charge may be suppressed and the variation of the threshold voltage to the negative side when negative voltage is applied to the gate voltage may be suppressed. In other words, the variation range of the threshold voltage when negative voltage is applied to the gate electrode may be reduced, enabling formation of the gate insulating film by which the threshold voltage is stable. Accordingly, even when either positive or negative voltage is applied to the gate electrode, variation of the threshold voltage may be suppressed, enabling a highly reliable silicon carbide semiconductor device having stable electrical characteristics to be provided. Further, according to the first embodiment, since the source electrode may be formed so that no gap is formed between a side wall of the contact hole and the source electrode, increased size of the unit cell may be avoided.

Figure 2:
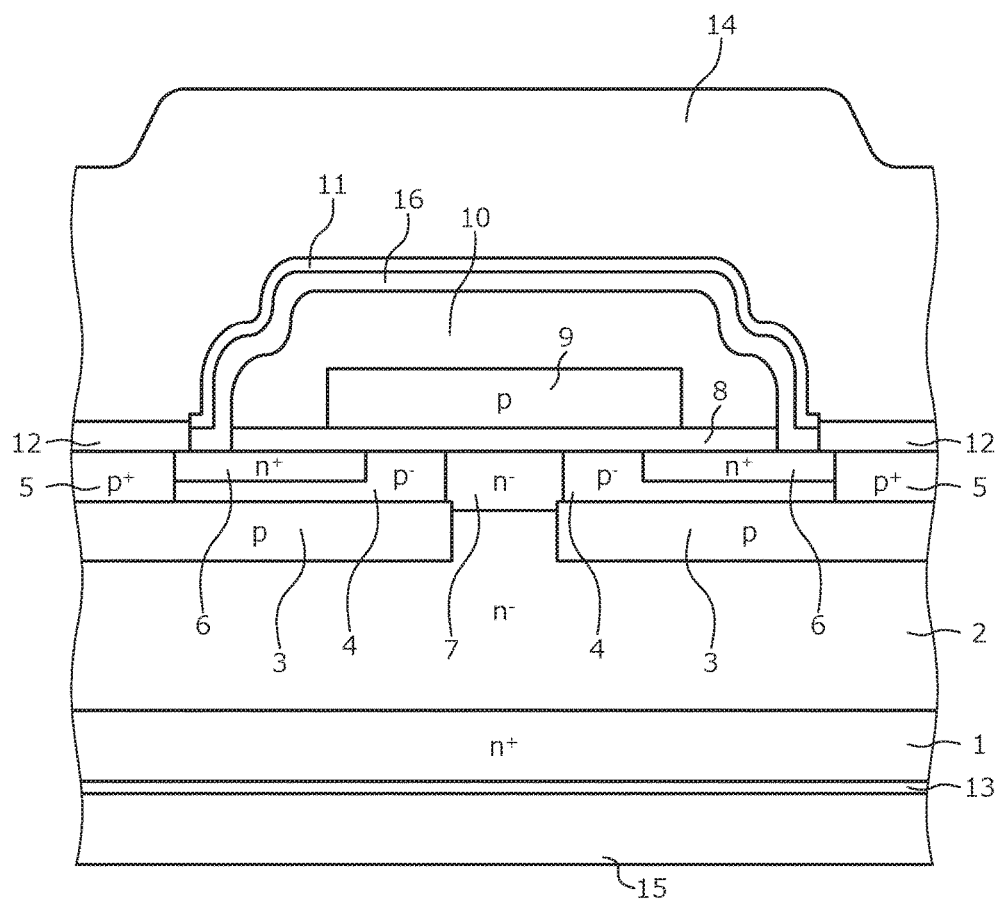
FIG. 2 is cross-sectional view of a structure of the silicon carbide semiconductor device according to a second embodiment.

A structure of the silicon carbide semiconductor device according to a second embodiment will be described. FIG. 2 is cross-sectional view of a structure of the silicon carbide semiconductor device according to the second embodiment. The silicon carbide semiconductor device according to the second embodiment differs from the silicon carbide semiconductor device according to the first embodiment in that on the interlayer insulating film 10, the titanium film 16 and the titanium nitride film 11 are sequentially provided. In other words, in the second embodiment, arrangement of the titanium film 16 and the titanium nitride film 11 are interchanged with respect to the first embodiment. Further, in the second embodiment, on the front silicide layer 12, the source electrode 14 contacts the front silicide layer 12 without provision of the titanium film 16.

The titanium nitride film 11 has a function of preventing the formation of an alloy film between the titanium film 16 and the source electrode 14 as a result the titanium film 16 and the source electrode 14 reacting consequent to the heat treatment performed after of the source electrode 14 is formed. Therefore, even after the product is completed, the thickness of the titanium film 16 may be maintained to be the thickness at the time of deposition (formation) of the titanium film 16. Further, the titanium nitride film 11 is chemically stable with respect to the titanium film 16 (not susceptible to chemical changes). Therefore, by providing the titanium nitride film 11 between the titanium film 16 and the source electrode 14, the thickness of the titanium film 16 does not decrease.

Furthermore, similar to the titanium film 16, the titanium nitride film 11 has a function of blocking hydrogen atoms/hydrogen ions that move from inside the source electrode 14 to the gate insulating film 8 side. The blocking effect of the hydrogen atoms/hydrogen ions by the titanium nitride film 11 will be described hereinafter in a fifth embodiment.

The method of manufacturing a silicon carbide semiconductor device according to the second embodiment, for example, is the method of manufacturing a silicon carbide semiconductor device according to the first embodiment in which after the contact hole is formed and before the titanium nitride film 11 is formed, the titanium film 16 is formed. In particular, first, similar to the first embodiment, the processes from depositing the $n^-$-type drift layer 2 to forming the contact hole are sequentially performed. Next, on the entire front surface of the silicon carbide semiconductor base, the titanium film 16 is formed so as to cover the interlayer insulating film 10. Next, the titanium nitride film 11 is formed on the titanium film 16. Next, portions of the titanium nitride film 11 and the titanium film 16 covering the $p^+$-type contact region 5 and the $n^+$-type source region 6 inside the contact hole are removed by photolithography and etching to again expose the $p^+$-type contact region 5 and the $n^+$-type source region 6 in the contact hole. In other words, the titanium nitride film 11 and the titanium film 16 are selectively removed using the same mask. Next, similar to the first embodiment, the front silicide layer 12 and the rear surface silicide layer 13 are formed. Next, the source electrode 14 is formed on the titanium nitride film 11 and the front silicide layer 12. Thereafter, similar to the first embodiment, the process of forming the passivation protective film and subsequent processes are sequentially performed whereby the SiC-vertical MOSFET depicted in FIG. 2 is completed.

As described, according to the second embodiment, effects identical to those of the first embodiment may be obtained. Further, according to the second embodiment, by the formation of the titanium nitride film between the titanium film and the source electrode, formation of an alloy film between the titanium film and the source electrode as a result of the titanium film and the source electrode reacting does not occur. Therefore, even after the product is completed, the thickness at the time of deposition of the titanium film may be maintained and the absorption/blocking effect of hydrogen atoms/hydrogen ions by the titanium film may be prevented from decreasing.

Figure 3:
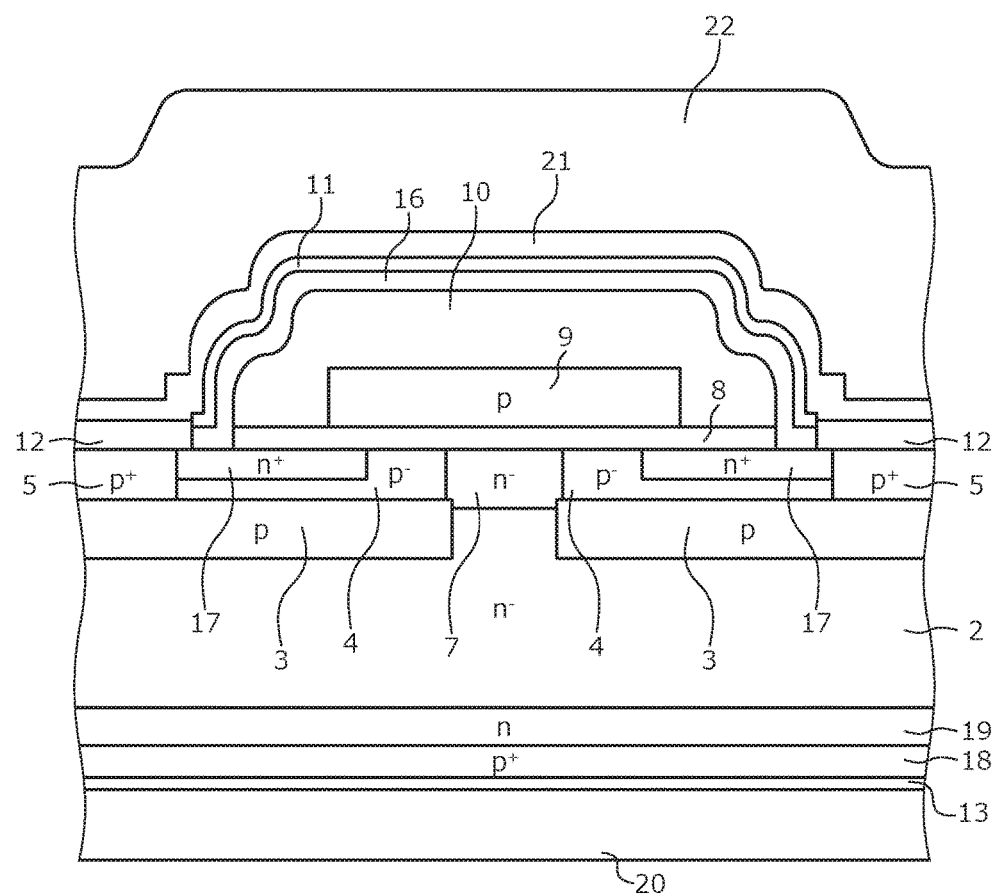
FIG. 3 is a cross-sectional view of a structure of the silicon carbide semiconductor according to a third embodiment.

A structure of the silicon carbide semiconductor according to the third embodiment will be described. FIG. 3 is a cross-sectional view of a structure of the silicon carbide semiconductor according to the third embodiment. The silicon carbide semiconductor according to the third embodiment differs from the silicon carbide semiconductor device according to the second embodiment on the following two points. The first difference is that a titanium film 21 is provided between the titanium nitride film 11 and the source electrode 14. In other words, a stacked film provided between the interlayer insulating film 10 and the source electrode 14 is formed by multiple titanium films (hereinafter, first and second titanium films) 16, 21 stacked via the titanium nitride film 11. The second titanium film 21, similar to the first titanium film 16, has a function of absorbing hydrogen atoms/hydrogen ions generated from inside the source electrode 14 and blocking the hydrogen atoms/hydrogen ions from reaching the interlayer insulating film 10 beneath.

The second difference is that application is to an insulated gate bipolar transistor (IGBT). In particular, in the third embodiment, in place of the $n^+$-type silicon carbide substrate that becomes an $n^+$-type drift region, the $p^+$-type silicon carbide substrate 18 that becomes a $p^+$-type collector region is used. An n-type layer 19 that becomes an n-type buffer layer (or an n-type field stop layer) is provided between the $p^+$-type silicon carbide substrate 18 and the $n^-$-type drift layer 2. An $n^+$-type emitter region 17, an emitter electrode 22, and a collector electrode 20 are provided in place of the $n^+$-type source region, the source electrode, and the drain electrode.

The method of manufacturing a silicon carbide semiconductor device according to the third embodiment, for example, may be the method of manufacturing a silicon carbide semiconductor device according the second embodiment in which the first titanium film 16, the titanium nitride film 11, the second titanium film 21, and the emitter electrode 22 are sequentially deposited as emitter wiring. In particular, first, on the $p^+$-type silicon carbide substrate 18 that becomes the $p^+$-type collector region, the n-type layer 19 and the $n^-$-type drift layer 2 are sequentially deposited by epitaxial growth. Next, similar to the second embodiment, the processes from forming the p-type semiconductor region 3 to forming the titanium nitride film 11 are sequentially performed.

Next, portions of the titanium nitride film 11 and the first titanium film 16 covering the $p^+$-type contact region 5 and the $n^+$-type emitter region 17 inside the contact hole are removed by photolithography and etching whereby the $p^+$-type contact region 5 and the $n^+$-type emitter region 17 are exposed in the contact hole. In other words, the titanium nitride film 11 and the first titanium film 16 are selectively removed using the same mask. Next, similar to the second embodiment, the front silicide layer 12 and the rear surface silicide layer 13 are formed. Next, on the second titanium film 21 and the front silicide layer 12, the second titanium film 21 and the emitter electrode 22 are sequentially formed. Thereafter, similar to the second embodiment, the process of forming the passivation protective film and subsequent processes are sequentially performed whereby the SiC-vertical MOSFET depicted in FIG. 3 is completed.

As described, according to the third embodiment, effects identical to those of the first and second embodiments may be obtained. Further, according to the third embodiment, by stacking the first and second titanium films between the interlayer insulating film and the emitter electrode, even in cases where step coverage of the first titanium film is poor such as the thickness of the first titanium film being thin a portions consequent to particles on the chip front surface, non-levelness caused by element structures on the chip front surface, and the like, by forming the second titanium film above the first titanium film, the thickness of the stacked film provided between the interlayer insulating film and the emitter electrode may be compensated at portions where the thickness of the titanium film is insufficient. As a result, the absorption/blocking effect of hydrogen atoms/hydrogen ions by the titanium film may be prevented from decreasing.

Figure 9:
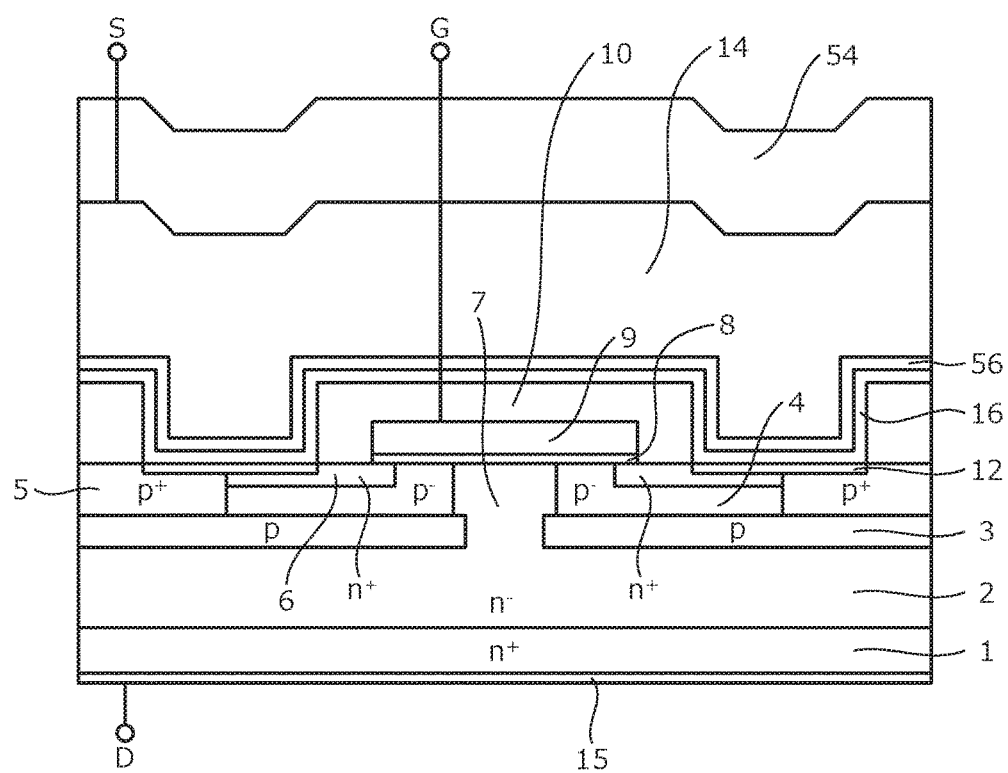
FIG. 9 is a cross-sectional view of a structure of the silicon carbide semiconductor device according to a fourth embodiment.

The structure of the silicon carbide semiconductor device according to a fourth embodiment will be described. FIG. 9 is a cross-sectional view of a structure of the silicon carbide semiconductor device according to the fourth embodiment. In FIG. 9, the conductivity type of reference numeral 3 is depicted to be a p-type (similarly in FIGS. 10 and 11). The silicon carbide semiconductor device according to the fourth embodiment differs from the silicon carbide semiconductor device according to the first embodiment in that between the titanium film 16 and the source electrode 14, a titanium aluminum (e.g., $TiAl_3$) alloy film 56 is provided. In the fourth embodiment, the titanium nitride film 11 is not provided between the titanium film 16 and the interlayer insulating film 10.

In particular, the titanium film 16 is provided on the surfaces of the interlayer insulating film 10 and the front silicide layer 12. The titanium film 16, similar to the first embodiment, has a function of absorbing hydrogen atoms/hydrogen ions generated from inside the source electrode 14. Further, the titanium film 16 functions as source wiring and is electrically insulated from the gate electrode 9 by the interlayer insulating film 10. On the surface of the titanium film 16, the titanium aluminum alloy film 56 is formed.

The titanium aluminum alloy film 56 is an alloy film formed by a reaction of the titanium film 16 and the source electrode 14. The titanium aluminum alloy film 56 functions as source wiring. The titanium aluminum alloy film 56 may have a thickness of about, for example, 10 nm or more and 50 nm or less. On the surface of the titanium aluminum alloy film 56, the source electrode 14 is provided so as to be embedded in the contact hole.

The source electrode 14 is electrically connected to the $p^+$-type contact region 5 and the $n^+$-type source region 6, via the titanium aluminum alloy film 56, the titanium film 16, and the front silicide layer 12. The source electrode 14 functions as source wiring. On the source electrode 14, a passivation protective film 54 that protects the chip front surface is provided. Excluding the metal layer arranged between the interlayer insulating film 10 and the source electrode 14, configuration is identical to that according to the first embodiment.

The method of manufacturing a silicon carbide semiconductor device according to the fourth embodiment will be described. First, for example, the $n^+$-type silicon carbide substrate (semiconductor wafer) 1 of a 4-layer periodic hexagonal crystal (4H-SiC) is prepared and similar to the first embodiment, the processes from forming the $n^-$-type drift layer 2 to forming the contact hole are sequentially performed. The front surface of the $n^+$-type silicon carbide substrate 1 may be, for example, a (000-1) face (so-called C-face). The $n^-$-type drift layer 2, for example, may be doped with $5 \times 10^{15}/cm^3$ of an n-type impurity such as nitrogen (N) and may be formed to have a thickness of about 10 μm by epitaxial growth.

A nickel (Ni) film is formed on the silicon carbide semiconductor portion (the $p^+$-type contact region 5 and the $n^+$-type source region 6) exposed in the contact hole. Next, the silicon carbide semiconductor portion and the nickel film are caused to react by sintering (heat treatment) to form the front silicide layer 12 having, for example, a thickness of 1.0 μm. Next, on the interlayer insulating film 10 and the front silicide layer 12, the titanium film 16 is deposited to have, for example, a thickness of 0.1 μm.

Next, similar to the first embodiment, on the titanium film 16, an aluminum layer to become the source electrode 14 is deposited to have, for example, a thickness of 5.0 μm. The titanium film 16 and the source electrode 14, for example, are successively formed by a sputtering method. Next, the source electrode 14 is patterned by photolithography and etching. The etching mask used in the patterning of the source electrode 14 is used as a mask to perform etching and pattern the titanium film 16. As a result, source wiring of a predetermined pattern is formed from the titanium film 16 and the source electrode 14.

Next, on the source electrode 14, a polyimide layer to become the passivation protective film 54 is formed and the passivation protective film 54 is hardened (cured) by heat treatment (annealing) at a temperature of about 380 degrees C., for example. The temperature of heat treatment performed after the formation of the source electrode 14 such as the heat treatment for this hardening, etc. may be 450 degrees C. or less. The reason for this is that the source electrode 14 has, as a main component, aluminum, which has a low heat tolerance. The titanium film 16 and the source electrode 14 are caused to react by the heat treatment performed after the source electrode 14 is formed whereby the titanium aluminum alloy film 56 is formed between the titanium film 16 and the source electrode 14.

The inventors confirmed that the titanium aluminum alloy film 56, for example, has a thickness of 50 nm or more by heat treatment at a temperature of 400 degrees C. or higher and has a thickness of 10 nm or less by heat treatment at a temperature about 380 degrees C. Further, the temperature of the heat treatment performed after the source electrode 14 is formed may be 380 degrees C. or higher and 400 degrees C. or lower. The reason is that the source electrode 14 has, as a main component, aluminum, which has a low heat tolerance. Therefore, the thickness of the titanium aluminum alloy film 56 as described above, for example, may be about 10 nm or more and 50 nm or less. Further, the thickness of the titanium film 16 at the time of deposition, the temperature of the heat treatment performed after the formation of the source electrode 14, and the like are set so that the thickness of the titanium film 16 remaining after the formation of the titanium aluminum alloy film 56 is 10 nm or more.

As described, when the titanium film 16, for example, is deposited to have a thickness of about 0.1 μm (=100 nm) and the temperature of the heat treatment performed after the formation of the source electrode 14 is, for example, about 380 degrees C., the titanium aluminum alloy film 56 is formed having a thickness of 10 nm or less and the titanium film 16 remains having a thickness of about 90 nm. Next, on the entire rear surface of the silicon carbide semiconductor base, the rear electrode 15 is formed. Thereafter, the silicon carbide semiconductor base is cut into individual chips whereby the SiC-vertical MOSFET depicted in FIG. 9 is completed.

In the silicon carbide semiconductor device according to the fourth embodiment as well, although hydrogen atoms/hydrogen ions are generated from inside the source electrode 14 under high-temperature operation, these hydrogen atoms/hydrogen ions are absorbed by the titanium film 16 beneath the source electrode 14. Therefore, the hydrogen atoms/hydrogen ions generated from inside the source electrode 14 may be prevented from diffusing near the gate insulating film 8 or into the gate insulating film 8.

With various conditions described herein as examples, a SiC-vertical MOSFET forming a channel (inversion layer) at a (000-1) face (i.e., an element having a C-face as the chip front surface) (hereinafter, example 1) was produced according to the method of manufacturing a silicon carbide semiconductor device according to the fourth embodiment described above, and variation of the threshold voltage was measured. The results confirm that under high-temperature operation where the operating temperature was 200 degrees C., after negative voltage of −3 MV/cm was applied to the gate electrode 9 for 1000 hours, the variation range of the threshold voltage could be suppressed to 0.1V or less.

Further, for a case where the front surface of the $n^+$-type silicon carbide substrate 1 was a (0001) face (so-called Si-face), similar to example 1, a SiC-vertical MOSFET was produced (hereinafter, example 2) and the variation of the threshold voltage was measured. In other words, example 2 is a SiC-vertical MOSFET (i.e., an element having a Si-face as the chip front surface) forming a channel in a (0001) face. Excluding the plane orientation of the chip front surface of example 2, the configuration is identical to that of example 1. Similar to example 1, the results indicate that in example 2 as well, a SiC-vertical MOSFET having a stable threshold voltage is possible.

The concentration of the hydrogen molecules absorbed by the titanium film 16 was verified. As a result of implanting hydrogen at a temperature of 400 degrees C. into a sample having a deposited titanium film of a thickness of 100 nm, hydrogen molecules ($H_2$) of a concentration of $6\times10^{17}/cm^2$ were absorbed by the titanium film having the thickness of 100 nm. In other words, the concentration of the hydrogen molecules absorbed in the titanium film having a thickness of 10 nm was confirmed to be $1\times10^{16}/cm^2$. Therefore, the thickness of the titanium film 16 is set to be a thickness enabling substantially all of the hydrogen atoms/hydrogen ions generated from inside the source electrode 14 under high-temperature operation to be absorbed.

As described, according to the fourth embodiment, effects identical to those of the first to third embodiments may be achieved.

Figure 10:
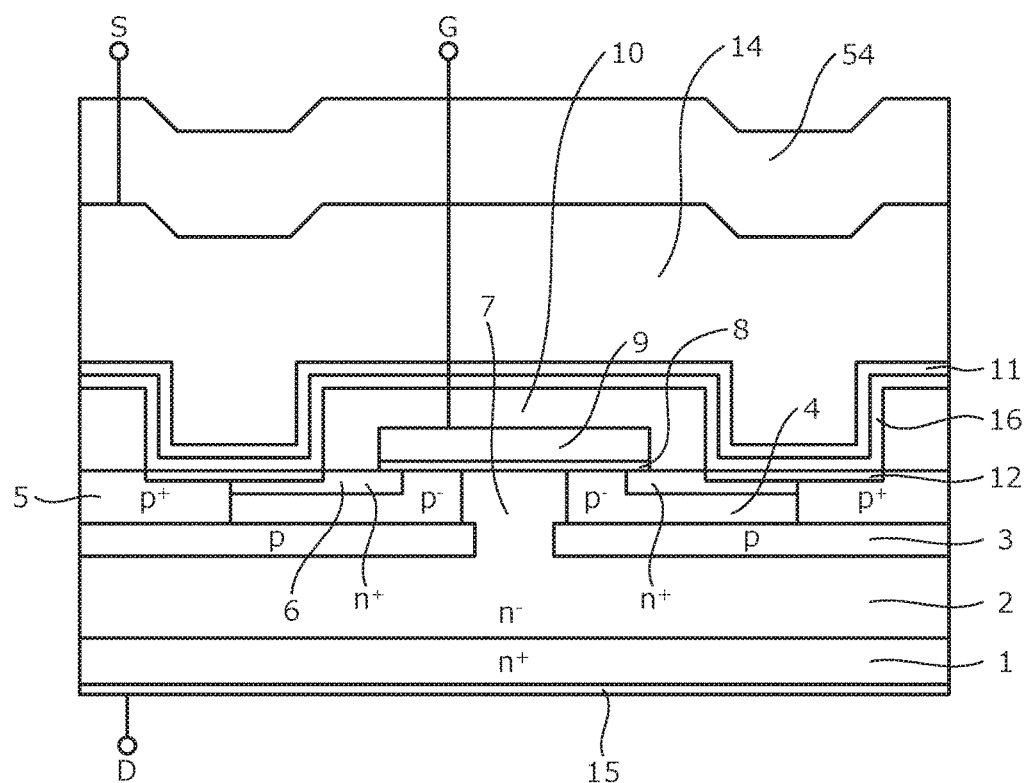
FIG. 10 is a cross-sectional view of a structure of the silicon carbide semiconductor device according to a fifth embodiment.

The structure of the silicon carbide semiconductor device according to a fifth embodiment will be described. FIG. 10 is a cross-sectional view of a structure of the silicon carbide semiconductor device according to the fifth embodiment. In the silicon carbide semiconductor device according to the fifth embodiment, the stacked structure of the metal layer in the contact hole differs from the second embodiment consequent a difference in manufacturing process flow and similar to the second embodiment, the titanium nitride film 11 is provided between the titanium film 16 and the source electrode 14. As described above, the titanium nitride film 11 has a function of blocking the movement of hydrogen atoms/hydrogen ions to the gate insulating film 8 side, the hydrogen atoms/hydrogen ions being generated from inside the source electrode 14. In other words, the diffusion coefficient of the hydrogen atoms/hydrogen ions inside the titanium nitride film 11 is small to the extent that the hydrogen atoms/hydrogen ions moving in the titanium nitride film 11 do not substantially reach the titanium film 16 beneath.

The silicon carbide semiconductor device according to the fifth embodiment may be produced by applying the method of manufacturing a silicon carbide semiconductor device according to the fourth embodiment. For example, the method of manufacturing a silicon carbide semiconductor device according to the fifth embodiment may be the method of manufacturing a silicon carbide semiconductor device according to the fourth embodiment in which after the formation of the titanium film 16 and before the formation of the source electrode 14, the titanium nitride film 11 is deposited on the titanium film 16. In other words, the titanium film 16, the titanium nitride film 11, and the source electrode 14 are sequentially deposited as source wiring. The thicknesses of titanium film 16, the titanium nitride film 11, and the source electrode 14 may be, for example, 0.1 μm, 0.1 μm, and 5.0 μm, respectively. The titanium film 16, the titanium nitride film 11, and the source electrode 14, for example, are successively formed by a sputtering method.

By forming the titanium nitride film 11 between the titanium film 16 and the source electrode 14, the titanium film 16 and the source electrode 14 do not contact each other. Therefore, in the heat treatment performed after the formation of the source electrode 14, a reaction layer (titanium aluminum alloy film) of the titanium film 16 and the source electrode 14 is not formed. Further, the titanium nitride film 11 is chemically stable with respect to the titanium film 16 (not susceptible to chemical changes). Therefore, the thickness of the titanium film 16 is maintained to be the thickness at time of deposition of the titanium film 16. Thus, the absorption effect of the hydrogen atoms/hydrogen ions by the titanium film 16 may be further improved compared to a case where an alloy film is formed between the titanium film 16 and the source electrode 14.

Further, verification concerning the hydrogen diffusion coefficient of the titanium nitride film 11 was performed. In particular, a sample was produced in which an oxide film ($SiO_2$ film) was formed on a verification-use silicon carbide semiconductor substrate by thermal oxidation and the titanium nitride film was deposited on this oxide film. With respect to this sample, after heat treatment at a temperature of 400 degrees C. was performed for 30 minutes in a hydrogen atmosphere, results of secondary ion mass spectrometry (SIMS) analysis of the composition of the oxide film formed on the sample did not detect hydrogen in the oxide film. In other words, it was confirmed that hydrogen atoms/hydrogen ions in the hydrogen atmosphere are blocked by the titanium nitride film and do not reach the oxide film beneath the titanium nitride film.

As described, according to the fifth embodiment, effects identical to those of the first to fourth embodiments may be obtained. Further, according to the fifth embodiment, hydrogen atoms/hydrogen ions generated from inside the source electrode under high-temperature operation are blocked by the titanium nitride film beneath the source electrode. Therefore, the movement of hydrogen atoms/hydrogen ions from inside the source electrode to the gate insulating film side may be further suppressed and the variation range of the threshold voltage may be further reduced.

Figure 11:
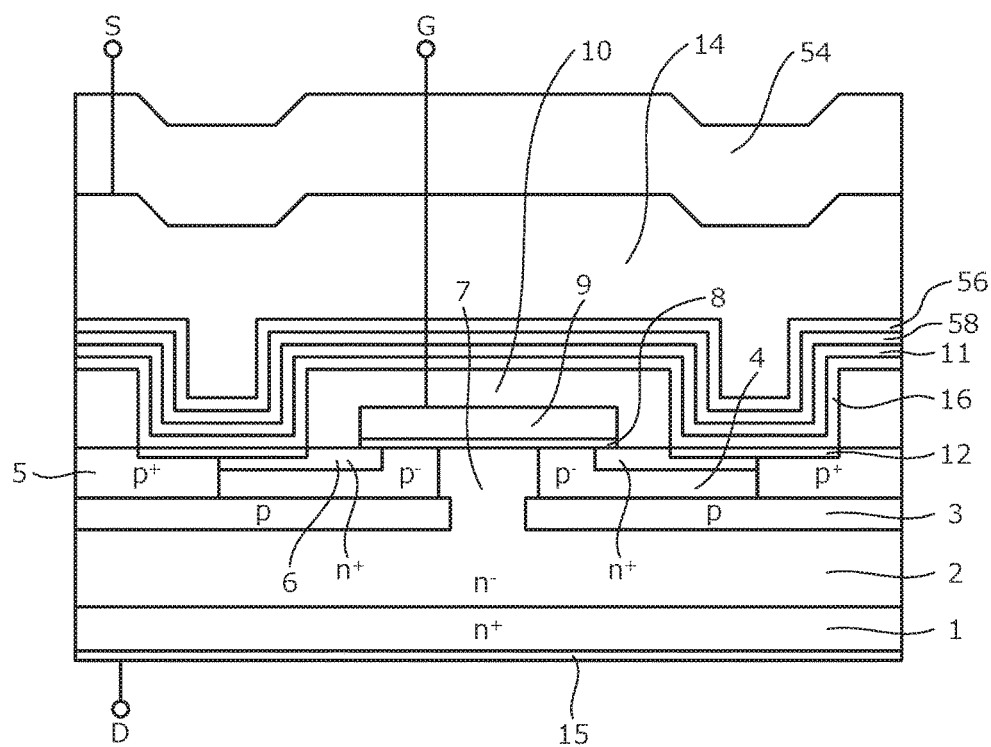
FIG. 11 is a cross-sectional view of a structure of the silicon carbide semiconductor device according to a sixth embodiment.

A structure of the silicon carbide semiconductor device according to a sixth embodiment will be described. FIG. 11 is a cross-sectional view of a structure of the silicon carbide semiconductor device according to the sixth embodiment. The silicon carbide semiconductor device according to the sixth embodiment differs from the silicon carbide semiconductor device according to the fifth embodiment in that between the titanium nitride film 11 and the source electrode 14, a second titanium film 58 and the titanium aluminum alloy film 56 are provided. The second titanium film 58, similar to the titanium film (hereinafter, the first titanium film) 16 beneath the titanium nitride film 11, has a function of absorbing hydrogen atoms/hydrogen ions generated from inside the source electrode 14.

The method of manufacturing a silicon carbide semiconductor device according to the sixth embodiment, for example, may be the method of manufacturing a silicon carbide semiconductor device according to the fourth embodiment in which after the formation of the first titanium film 16 and before the formation of the source electrode 14, the titanium nitride film 11 and the second titanium film 58 are deposited on the first titanium film 16. The thicknesses of the first titanium film 16, the titanium nitride film 11, the second titanium film 58, and the source electrode 14 at the time of deposition, for example, may be 0.1 μm, 0.1 μm, 0.1 μm, and 5.0 μm, respectively.

By stacking, in this manner, the metal layers that become source wiring, thereafter, the titanium aluminum alloy film 56, which is a reaction layer of the second titanium film 58 and the source electrode 14, is formed between the second titanium film 58 and the source electrode 14 by the heat treatment after the formation of the source electrode 14. In other words, the first titanium film 16, the titanium nitride film 11, the second titanium film 58, the titanium aluminum alloy film 56, and the source electrode 14 are sequentially deposited as source wiring.

As described, according to the sixth embodiment, effects identical to those of the first to fifth embodiments may be obtained. Further, according to the sixth embodiment, the absorption effect of the hydrogen atoms/hydrogen ions by the second titanium film between the source electrode and the first titanium film may be further improved. As a result, the movement of hydrogen atoms/hydrogen ions from inside the source electrode to the gate insulating side may be further suppressed and the variation range of the threshold voltage may be further reduced.

Figure 4:
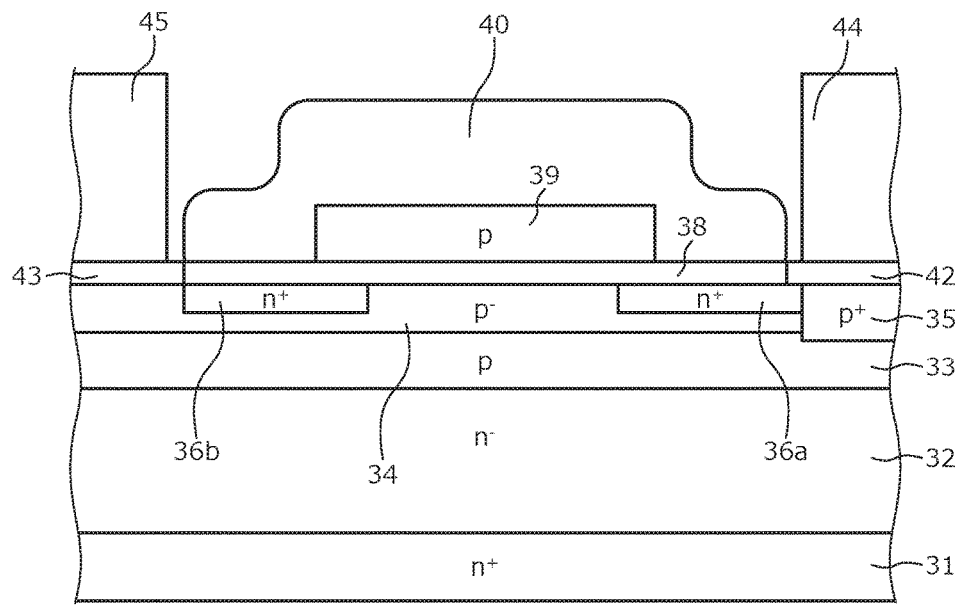
FIG. 4 is a cross-sectional view of a structure of a silicon carbide semiconductor device of a comparison example.
Figure 8:
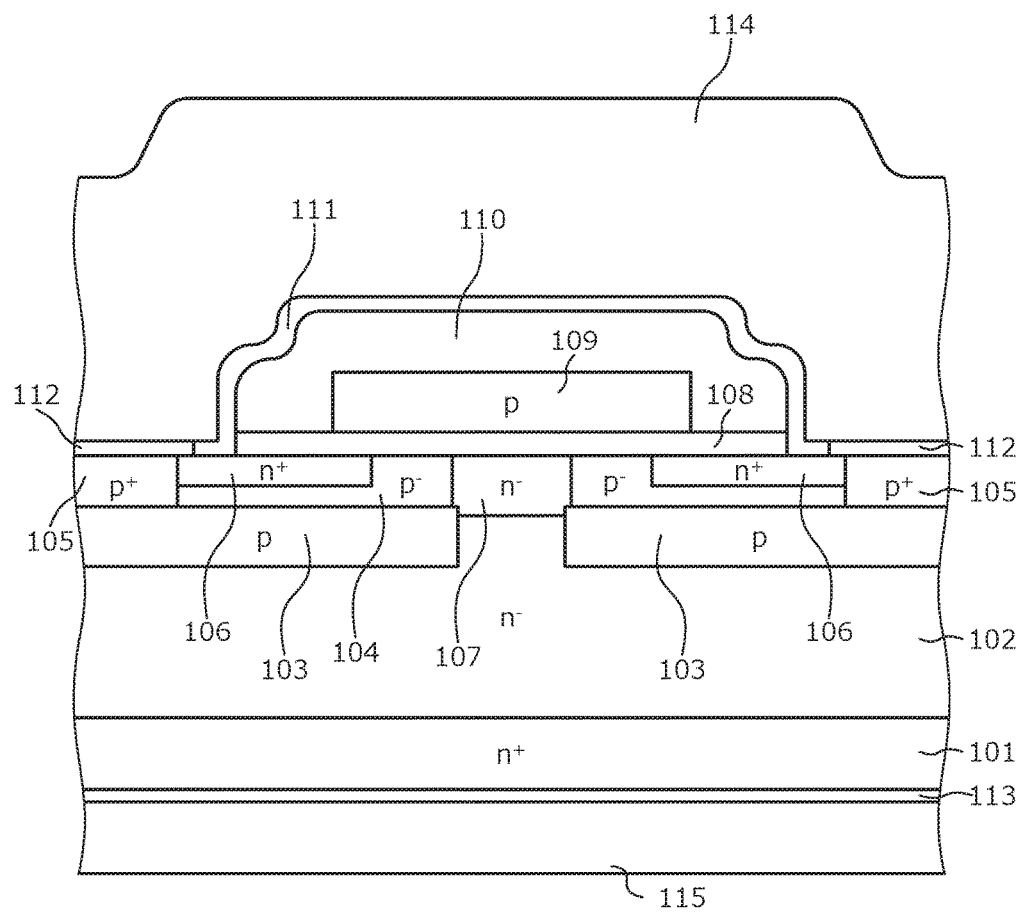
FIG. 8 is a cross-sectional view of a structure of a conventional silicon carbide semiconductor device.

The cause of the threshold voltage variation in the conventional SiC-MOSFET (hereinafter, conventional example, refer to FIG. 8) was verified. In the conventional example, the high interface state density of the $SiO_2$/SiC interface is a problem specific to the $SiO_2$/SiC interface and at present, it is not clear if this occurs consequent to differences in the band structure, the amount of deformation, and the amount of defects of the $SiO_2$/SiC interface. Thus, a SiC-MOSFET (hereinafter, comparison example) in which the arrangement of aluminum layers as electrode layers differed from the conventional example was referred to and verification concerning the cause of the threshold voltage variation in the conventional example was performed. FIG. 4 is a cross-sectional view of a structure of the silicon carbide semiconductor device of the comparison example. First, the structure of the comparison example depicted in FIG. 4 will be described.

The comparison example depicted in FIG. 4 is a SiC-horizontal MOSFET having a planar gate structure of a configuration in which on an interlayer insulating film 40, no electrode layer (aluminum layer) is arranged; and in the contact hole, the electrode layer and the interlayer insulating film 40 do not contact each other. The comparison example is a horizontal type of the MOS gate structure of the conventional example and the impurity concentrations, thicknesses, etc. of the regions of the comparison example are the same as those of the corresponding regions in the conventional example. Although the horizontal MOSFET does not require an $n^+$-type silicon carbide substrate 31 or an $n^-$-type drift layer 32, a vertical MOSFET is concurrently formed on the same wafer and thus, such a structure is used. Further, in the comparison example, electrode layers (a source electrode 44 and a drain electrode 45) and the interlayer insulating film 40 are arranged so as to not contact each other.

In particular, in the comparison example, on the front surface of the $n^+$-type silicon carbide substrate (semiconductor chip) 31, a silicon carbide epitaxial layer becoming the $n^-$-type drift layer 32 is provided. In the surface layer on the opposite side of the $n^-$-type drift layer 32 from the $n^+$-type silicon carbide substrate 31 side, the p-type semiconductor region 33 is selectively provided. On the surface of the opposite side of the $n^-$-type drift layer 32 from the $n^+$-type silicon carbide substrate 31 side, a silicon carbide epitaxial layer to become a $p^-$-type well layer 34 is provided so as to cover the p-type semiconductor region 33. In the $p^-$-type well layer 34, a $p^+$-type contact region 35, an $n^+$-type source region 36a and an $n^+$-type drain region 36b are each selectively provided.

The $p^+$-type contact region 35 contacts the $n^+$-type source region 36a. The $n^+$-type drain region 36b is arranged away from the $n^+$-type source region 36a. On the surface of a portion of the $p^-$-type well layer 34 between the $n^+$-type source region 36a and the $n^+$-type drain region 36b, a gate electrode 39 is provided via a gate insulating film 38. The interlayer insulating film 40 covers the gate electrode 39. The source electrode 44 contacts the $p^+$-type contact region 35 and the $n^+$-type source region 36a, via a silicide layer 42. The drain electrode 45 contacts the $n^+$-type drain region 36b, via a silicide layer 43. The source electrode 44 and the drain electrode 45 are provided in the contact hole so as to not contact the interlayer insulating film 40.

The comparison example depicted in FIG. 4 is produced as follows. First, on the front surface of the $n^+$-type silicon carbide substrate (semiconductor wafer) 31, the silicon carbide epitaxial layer becoming the $n^-$-type drift layer 32 is deposited. Next, in the surface layer of the $n^-$-type drift layer 32, the p-type semiconductor region 33 is formed by ion implantation. On the p-type semiconductor region 33, the silicon carbide epitaxial layer becoming the $p^-$-type well layer 34 is deposited. In the $p^-$-type well layer 34, the $n^+$-type source region 36a and the $n^+$-type drain region 36b are each selectively formed by ion implantation of phosphorus.

Further, in the $p^-$-type well layer 34, the $p^+$-type contact region 35 is selectively formed by ion implantation of aluminum. Next, activation annealing is performed at a temperature of 1600 degrees C. in an argon atmosphere. Next, on the surface of a portion of the $p^-$-type well layer 34 between the $n^+$-type source region 36a and the $n^+$-type drain region 36b, the gate insulating film 38 is formed by thermal oxidation in a nitrous oxide atmosphere. On the gate insulating film 38, a poly-silicon layer becoming the gate electrode 39 is formed. Next, the interlayer insulating film 40 is formed so as to cover the gate electrode 39.

Next, first and second contact holes that penetrate the interlayer insulating film 40 in the depth direction are formed by photolithography and etching whereby in the $p^+$-type contact region 35 and the $n^+$-type source region 36a are exposed in the first contact hole and the $n^+$-type drain region 36b is exposed in the second contact hole. Next, on the silicon carbide semiconductor portions exposed in the first and second contact holes, a nickel film is formed; and by sintering, the silicon carbide semiconductor portions and the nickel film are caused to react and form nickel silicide layers (the silicide layers 42, 43).

Next, on the interlayer insulating film 40 and the silicide layers 42, 43, an aluminum layer is deposited and patterned to leave the aluminum layer only in the first and second contact holes to become the source electrode 44 and the drain electrode 45. At this time, the source electrode 44 and the drain electrode 45 are formed away from the interlayer insulating film 40 so as to not contact the interlayer insulating film 40. Thereafter, the silicon carbide semiconductor base is cut into individual chips whereby the SiC-horizontal MOSFET of the comparison example depicted in FIG. 4 is completed.

With respect to the comparison example, variation of the threshold voltage was measured after a negative voltage of −3 MV/cm was applied to the gate electrode 39 for 10 minutes under high-temperature operation in which the operating temperature becomes 200 degrees C. The variation range of the threshold voltage was ±0.1V or less. In the comparison example having a configuration in which the electrode layers (the source electrode 44, the drain electrode 45) do not contact the interlayer insulating film 40 in this manner, the threshold voltage does not vary. Thus, with respect to the conventional example having a configuration in which the electrode layer and the interlayer insulating film contact each other, elemental analysis by thermal desorption spectroscopy (TDS) was performed at the interface of the interlayer insulating film 110 and the electrode layer (the source electrode 114) and inside the source electrode 114. The results detected hydrogen molecules of an impurity concentration of $3 \times 10^{14}/cm^2$ or more in the conventional example when the chip temperature was raised to 200 degrees C. or higher. Therefore, the generation of hydrogen atoms/hydrogen ions from the interface of the interlayer insulating film 110 and the source electrode 114 and from the source electrode 114 is surmised to result from a reaction of water ($H_2O$) included in the water vapor atmosphere during the thermal oxidation and aluminum that is a constituent material of the source electrode 114.

In general, when a SiC-MOSFET is manufactured, a large amount of hydrogen ions are taken in by the $SiO_2$/SiC interface consequent to a thermal oxidation process for oxide film formation at a temperature of 800 degrees C. or higher or an annealing process at a temperature of 800 degrees C. or higher. The hydrogen ions taken in by the $SiO_2$/SiC interface consequent to this high-temperature heat treatment of 800 degrees C. or higher bond with dangling bonds of the $SiO_2$/SiC interface, forming silicon-hydrogen (Si—H) bonds and carbon-hydrogen (C—H) bonds and become fixed. The hydrogen atoms of the silicon-hydrogen bonds and carbon-hydrogen bonds formed at the $SiO_2$/SiC interface by this high-temperature heat treatment do not change (dissociate) with low-temperature heat treatment of 400 degrees C. or less.

On the other hand, the electrode layer (aluminum layer for wiring) is deposited on the interlayer insulating film by low-temperature heat treatment 400 degrees C. or less. The hydrogen atoms/hydrogen ions generated from inside the electrode layer or the interface of the interlayer insulating film and the electrode layer at the time of deposition of the electrode layer by the low-temperature heat treatment do not become fixed and move to the $SiO_2$/SiC interface when negative voltage is applied to the gate electrode of the SiC-MOSFET under high-temperature operation. It is surmised that these hydrogen atoms/hydrogen ions cause the fixed hydrogen atoms to dissociate from the silicon-hydrogen bonds and the carbon-hydrogen bonds of the $SiO_2$/SiC interface and form dangling bonds of silicon atoms and carbon atoms ($Si^+$, $C^+$) whereby positive charge is generated inside the gate insulating film or near the $SiO_2$/SiC interface.

For example, the diffusion coefficient of the hydrogen atoms/hydrogen ions inside the oxide film ($SiO_2$ film) at 200 degrees C. is $1.0 \times 10^8$ cm$^2$/second and the diffusion distance in 10 minutes is 24.5 μm. Therefore, in a case where the interlayer insulating film 110 and the source electrode 114 contact each other in the contact hole such as in the conventional example, hydrogen atoms/hydrogen ions generated at the interface of the interlayer insulating film 110 and the source electrode 114 or inside the source electrode 114 under high-temperature operation easily move in the interlayer insulating film 110 and reach the gate insulating film 108, causing the threshold voltage to vary. Although manufacturing of a SiC-vertical MOSFET having a structure in which the interlayer insulating film 110 and the source electrode 114 do not contact each other in the contact hole is possible, the size of the unit cell (unit region forming a single MOS gate structure) increases consequent to a gap that occurs between the side wall of the contact hole and the source electrode 114 and therefore, practical use is difficult.

In the present invention, as described, between the interlayer insulating film 10 and the source electrode 14, the titanium film 16 is formed to cover the interlayer insulating film 10 whereby hydrogen atoms/hydrogen ions generated from inside the source electrode 14 are absorbed/blocked by the titanium film 16. As a result, the hydrogen atoms/hydrogen ions may be prevented from moving to the gate insulating film side and diffusing into the gate insulating film, enabling the variation range of the threshold voltage when negative voltage is applied to the gate electrode to be decreased. For example, SiC-vertical MOSFET chips having differing thicknesses of the titanium film 16 were produced (hereinafter, Examples) according to the described method of manufacturing a silicon carbide semiconductor device according to the first embodiment, under the various conditions described above and by variously changing the thickness of the titanium film 16. The threshold voltages of the Examples were measured. The results reveal that among the Examples, in the semiconductor chips having the titanium film 16 of a thickness ranging from 50 nm to 300 nm, the amount of variation of the threshold voltage after a negative voltage of −3 MV/cm was applied to the gate electrode 9 for 1000 hours under high-temperature operation where the operating temperature is 200 degrees C. was suppressed to ±0.1V. Therefore, it was found that in the present invention, the source electrode 14 may be formed without formation of a gap between the side wall of the contact hole and the electrode layer (the source electrode 14) and increases in the size of the unit cell may be avoided.

Figure 5:
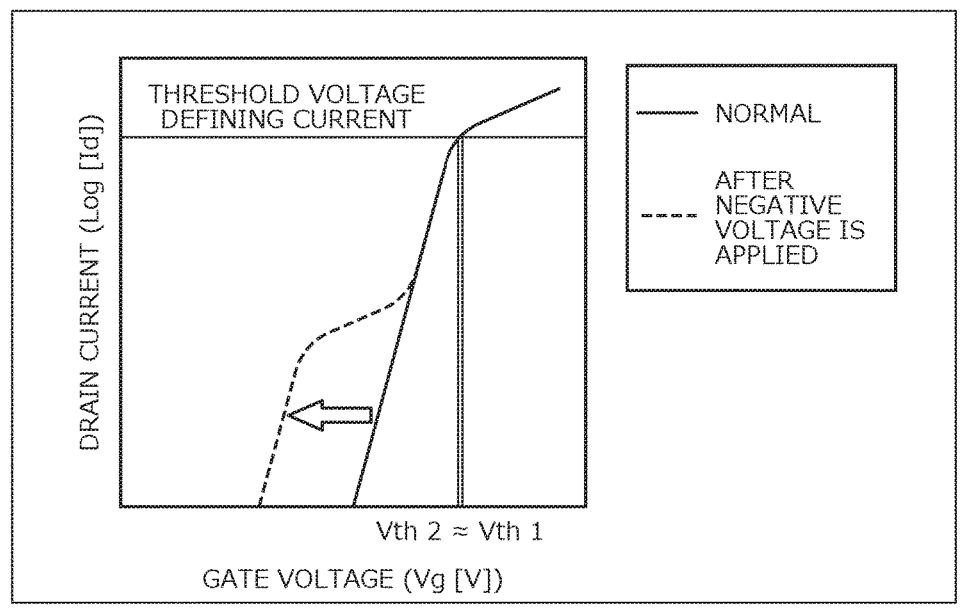
FIG. 5 is a characteristics diagram depicting threshold voltage variation when negative voltage is applied to a gate electrode of silicon carbide semiconductor devices according to Examples.

Further, with respect to the semiconductor chips of the Examples, the relationship of the gate voltage and drain current (the output characteristics) were verified. FIG. 5 is a characteristics diagram depicting threshold voltage variation when negative voltage is applied to the gate electrode of the silicon carbide semiconductor devices according to the Examples. In FIG. 5, the horizontal axis is the gate voltage Vg, the vertical axis is the logarithm of the drain current Id, and the relationship of the gate voltage and the drain current when positive voltage is applied to the drain is schematically depicted. As depicted in FIG. 5, in all of the Examples, it was confirmed that the threshold voltage Vth1 required for the threshold voltage defining current to flow normally (solid line) and the threshold voltage Vth2 required for the threshold voltage defining current to flow after negative voltage is applied to the gate electrode 9 (dashed line) are substantially equal (Vth1≈Vth2). However, it was confirmed that semiconductor chips were present in which for a relatively short period during gate voltage application, in a subthreshold region (region in which the drain current Id increases exponentially with respect to the gate voltage Vg; in particular, a region where the gate voltage Vg reaches the threshold voltage Vth1), the threshold voltage varied on the negative side (shift from solid line position to dashed line position indicated by leftward pointing arrow).

Thus, with respect to the semiconductor chips in which threshold voltage variation occurs in the subthreshold region among the semiconductor chips of the Examples, an optical beam induced resistance change (OBIRCH) method was used and temperature rise of the chip surface was detected. The results confirm that among the semiconductor chips of the Examples, in semiconductor chips having the titanium film 16 of a thickness of 50 nm or less, heat is generated at a small region (defective location) of the unit cell (hexagonal cell). Observation of a chip cross-section of chips having this heat generating location confirmed poor step coverage of the titanium film 16 in which the thickness of the titanium film 16 was thin at portions as a result of particles on the chip front surface and non-levelness resulting from element structures the chip front surface. It is surmised that observation of threshold voltage variation only near portions where the thickness of the titanium film 16 is thin and threshold voltage variation at the subthreshold region is consequent to a decreased absorption/blocking effect of the hydrogen atoms/hydrogen ions at these portions where the thickness of the titanium film 16 is thin.

Meanwhile, among the semiconductor chips of the Examples, in elements having the titanium film 16 of a thickness of 200 nm or greater, heat generation was confirmed by an OBIRCH method. Observation of a chip cross-section of chips having this heat generating location confirmed micro cracks in the surface of the titanium film 16 in the semiconductor chips having the titanium film 16 of a thickness of 200 nm or greater. Further, in the semiconductor chips having the titanium film 16 of a thickness of 300 nm or greater, cracking in the surface of the titanium film 16 was clearly confirmed to occur with a significant probability in substantially all of the unit cells on the semiconductor chip. It is surmised that accompanying the increased thickness of the titanium film 16, the internal stress of the titanium film 16 increases and to release this internal stress, cracks occurred in the titanium film 16. Such threshold voltage variation in the subthreshold region is extremely small in terms of current and adverse effects on the overall output characteristics of a single element (semiconductor chip) is small; however, current may concentrate at some of the elements (semiconductor chip) leading to destruction. Further, when subthreshold variation is great, this may cause leak current in the OFF state. Therefore, a countermeasure for variation of the output characteristics in the subthreshold region is desirable.

Figure 6:
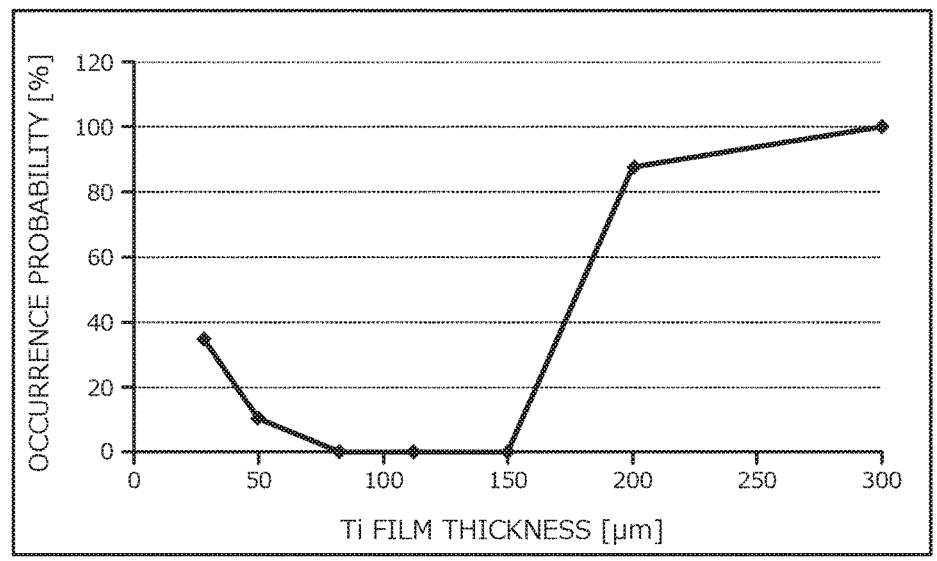
FIG. 6 is a characteristics diagram depicting a relationship of titanium film thickness and occurrence probability of variation of threshold voltage in a subthreshold region.

Countermeasures for suppressing variation of the threshold voltage in the subthreshold region were verified. In particular, the relationship of the thickness of the titanium film 16 (Ti film thickness) and the occurrence probability of variation of the threshold voltage in the subthreshold region (shift from the solid line position to the dashed line position indicated by the leftward pointing arrow in FIG. 5) was verified. FIG. 6 is a characteristics diagram depicting the relationship of the thickness of the titanium film and the occurrence probability of variation of the threshold voltage in the subthreshold region. As depicted in FIG. 6, the occurrence probability of variation of the threshold voltage in the subthreshold region was confirmed to increase when the thickness of the titanium film 16 is 50 nm or less and becomes extremely large when the thickness of the titanium film 16 is 200 nm or greater. On the other hand, when the thickness of the titanium film 16 is 80 nm or greater and 150 nm or less, variation of the threshold voltage in the subthreshold region was confirmed to not occur.

In the present invention, the reason variation of the threshold voltage in the subthreshold region can be made to not occur is because the interlayer insulating film 10 is completely covered by the titanium film 16 provided beneath the source electrode 14 (wiring layer) whereby the source electrode 14 and the interlayer insulating film 10 do not contact each other. For example, in Japanese Laid-Open Patent Publication No. 2009-194127, since the titanium film is used as a barrier metal of the contact portion and as a Schottky electrode, at portions other than that contacting the silicon carbide semiconductor portion (i.e., between the wiring layer and the interlayer insulating film), the titanium film is not necessarily required. Therefore, in Japanese Laid-Open Patent Publication No. 2009-194127, as depicted in FIG. 1 of Japanese Laid-Open Patent Publication No. 2009-194127, above the gate electrode, there is a portion where the titanium film is not provided on the interlayer insulating film and this portion contacts the wiring layer and the interlayer insulating film. In a structure in which the wiring layer and the interlayer insulating film contact each other in this manner, a large variation of the threshold voltage is observed when negative voltage is applied to the gate electrode. In other words, it was found that even when a very small portion of the wiring layer and the interlayer insulating film contact each other, at the interface of the gate insulating film and the silicon carbide semiconductor portion ($SiO_2$/SiC interface) via the interlayer insulating film and the gate insulating film, a substance (hydrogen atoms/hydrogen ions) causing variation of the threshold voltage diffuses and variation of the threshold voltage occurs.

In the present invention, in the first, the second, and the fourth to sixth embodiments, a SiC-vertical MOSFET is described as an example, however, the present invention is applicable to other MOS silicon carbide semiconductor devices such as SiC-horizontal MOSFETs and SiC-IGBTs and the same effects are achieved. Further, in the third embodiment, a SiC-IGBT is described as an example, however, the present invention is applicable to other MOS silicon carbide semiconductor devices such as SiC-MOSFETs and the same effects are achieved. Even in cases where in place of the planar gate structure, a trench gate structure is adopted, the same effects are achieved. Further, the structure may be one in which the $p^+$-type contact region and the $n^+$-type source region are selectively formed in the $p^-$-type semiconductor region functioning as a base region, without providing the $p^-$-type well layer. Although the present invention, for example, is particularly effective for elements forming a channel in a (000-1) face of a 4-layer periodic hexagonal crystal silicon carbide (4H-SiC) semiconductor (i.e., elements having a C-face as the chip front surface), the same effects are achieved in elements forming a channel in other plane orientations (e.g., (0001) face (a so-called Si-face), (11-20) face, (03-38) face). Further, in the embodiments described above, for example, dimensions, impurity concentrations, and the like of constituent parts may be variously set according to required specifications.

With a conventional silicon carbide semiconductor device, however, from the results of extensive research, the inventors found that when negative voltage is applied to the gate electrode, the threshold voltage (Vth) varies greatly. In putting a silicon carbide semiconductor device into practical use, achieving high reliability enabling stable operation even during stress application (voltage, temperature) is problematic. For example, to obtain a higher critical field strength with a SiC-power MOSFET compared to a Si-power MOSFET, the impurity concentration of the drift region may be increased, enabling a low ON resistance to be facilitated. Nonetheless, reverse transfer capacitance between the drain and gate is large and large current flows through the gate via the reverse transfer capacitance consequent to a dV/dt surge generated on the drain side.

When the threshold voltage is exceeded by the gate voltage increasing by a voltage drop such as gate wiring impedance resulting from current flowing in the gate, a problem arises in that the SiC-power MOSFET is turned ON by errant operation. Therefore, in many applications, at the time of driving, positive voltage for turning ON the SiC-power MOSFET and negative voltage for maintaining the OFF state of the SiC-power MOSFET and preventing turn ON by errant operation are both high voltages applied to the gate electrode. Further, the SiC-power MOSFET has to guarantee operation under high-temperature environments where the junction (joining) temperature is 200 degrees C. or higher.

In particular, electric field strength of about ±2 MV/cm to ±4 MV/cm is applied to the gate insulating film and a guaranteed operating temperature of about 200 degrees C. is required. In this case, under certain conditions, a phenomenon of the threshold voltage greatly varying has been observed. Hereinafter, the results of verification of electrical characteristics of the SiC-power MOSFET obtained by a reliability test will be described. First, according to the conventional method of manufacturing a silicon carbide semiconductor device described above, the conventional SiC-MOSFET depicted in FIG. 8 was produced (manufactured) under the various conditions described above (hereinafter, conventional example). Concerning this conventional example, under high-temperature operation in which the operating temperature (junction temperature) becomes 200 degrees C., 3 MV/cm (positive voltage) and −3 MV/cm (negative voltage) were each applied for 10 minutes to the gate electrode 109 and threshold voltage variation was observed.

Figure 7:
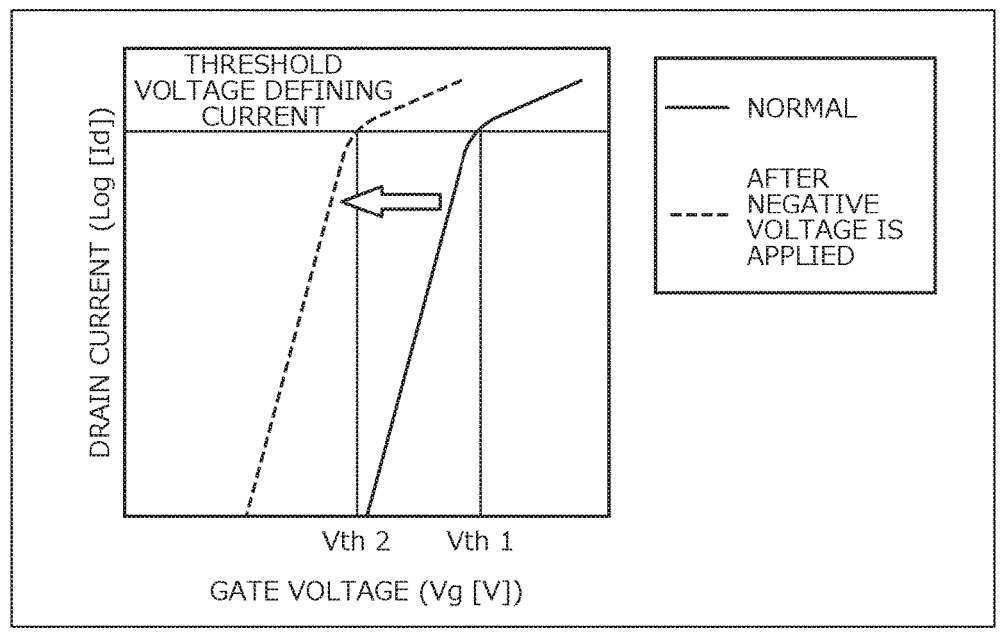
FIG. 7 is a characteristics diagram depicting threshold voltage variation when negative voltage was applied to a gate electrode of a conventional silicon carbide semiconductor device.

As a result, when positive voltage was applied to the gate electrode 109, variation of the threshold voltage was small and the variation range (amount of variation) was confirmed to be ±0.1V or less. The variation range of the threshold voltage is the difference from the threshold voltage (reference value) at the time of product shipping, based on design conditions. On the other hand, when negative voltage was applied to the gate electrode 109, the threshold voltage varied greatly on the negative side (i.e., the threshold voltage decreased). FIG. 7 is a characteristics diagram depicting threshold voltage variation when negative voltage was applied to the gate electrode of the conventional silicon carbide semiconductor device. In FIG. 7, the horizontal axis is a gate voltage Vg, the vertical axis is the logarithm of drain current Id, and the relationship of the gate voltage and the drain current (output characteristics) when positive voltage was applied to the drain is depicted schematically. A threshold voltage defining current is a drain current value (for example, ¹⁄₁₀₀₀ of the rated current) set for defining the threshold voltage (similarly in FIG. 5).

As depicted in FIG. 7, in the conventional example, when negative voltage was applied to the gate electrode 109 under high-temperature operation, the output characteristics move substantially parallel with respect to the horizontal axis (the gate voltage) on the negative side and the threshold voltage as viewed from the threshold voltage defining current was confirmed to decrease from Vth1 to Vth2 (movement from solid line position to dashed line position indicated by leftward pointing arrow). Vth1 is the threshold voltage necessary for the threshold voltage defining current to flow at normal times (solid line). A normal time is a time of the gate voltage application when determined output characteristics based on design conditions are obtained. Vth2 (dashed line) is the threshold voltage required for the threshold voltage defining current to flow after negative voltage is applied to the gate electrode 109. As a result of the extensive research of the inventors, in the conventional SiC-MOSFET depicted in FIG. 8, it was confirmed that the titanium nitride film 111 provided between the source electrode 114 and the interlayer insulating film 110 had some effect of suppressing variation of the threshold voltage but was insufficient. Further, the inventors confirmed that variation of the threshold voltage occurred when negative voltage was applied to the gate electrode in Japanese Laid-Open Patent Publication No. 2009-194127.

Figure 12:
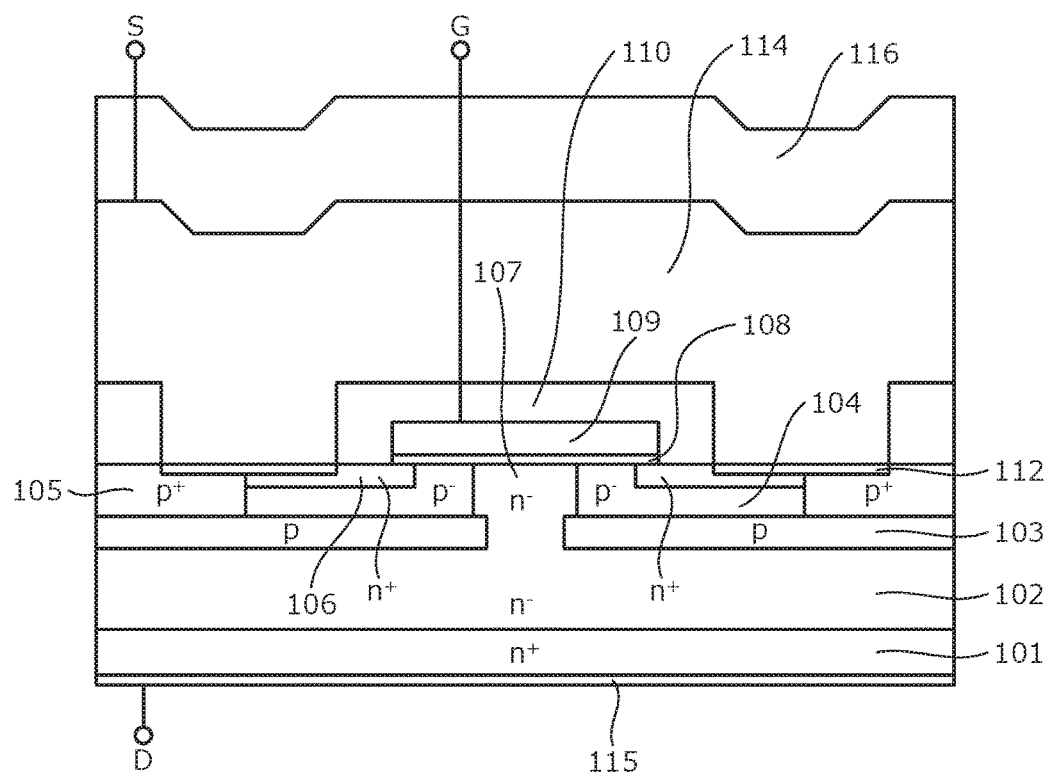
FIG. 12 is a cross-sectional view of a structure of a conventional silicon carbide semiconductor device.

The above phenomenon of the threshold voltage varying on the negative side similarly occurs in the conventional SiC-MOSFET depicted in FIG. 12. This phenomenon of the threshold voltage varying on the negative side indicates that near a junction interface ($SiO_2$/SiC interface) of the gate insulating film 108 and the silicon carbide semiconductor portion or in the gate insulating film 108 ($SiO_2$ film), positive charge (holes) are captured and charge, generating a positive fixed charge consequent to the application of negative voltage to the gate electrode 109 under high-temperature operation.

There are few reports of the phenomenon of positive fixed charge being generated in the gate insulating film or at a junction interface (hereinafter, $SiO_2$/Si interface) of the gate insulating film and the silicon semiconductor portion when negative voltage is applied to the gate electrode in a Si-MOSFET or a Si-insulated gate bipolar transistor (IGBT) using a silicon semiconductor. For example, although there are some reports of the phenomenon (slow trap phenomenon) of the gate threshold voltage varying in a Si-p channel-type MOSFET when negative voltage is applied to the gate electrode, the variation range of the threshold voltage is 0.1V even when the operating temperature is 150 degrees C. and a negative voltage of −3 MV/cm is applied to the gate electrode for 1000 hours.

The variation range of the threshold voltage of the SiC-MOSFET under the same conditions (operating temperature of 150 degrees C., gate voltage of −3 MV/cm) is −7V or more and therefore, the variation range of the threshold voltage for the Si-MOSFET and that for the SiC-MOSFET greatly differ. In particular, the interface state density of the $SiO_2$/Si interface in the Si-MOSFET is $1.0\times10^{11}$ cm$^{-2}$ eV$^{-1}$ or less. On the other hand, the interface state density of the $SiO_2$/SiC interface in the SiC-MOSFET is $1.0\times10^{12}$ cm$^{-2}$ eV$^{-1}$ or more. Although a majority of research is on reducing the interface state density of the $SiO_2$/SiC interface, a technique of reducing the interface state density of the $SiO_2$/SiC interface to about the same extent as the interface state density of the $SiO_2$/Si interface has not been reported.

According to the invention above, the first metal layer and the first main electrode are prevented from forming an alloy by the second metal layer provided between the first metal layer and the first main electrode whereby the thickness of the first metal layer may be prevented from becoming thinner than the thickness at the time of formation of the first metal layer. Therefore, the absorption/blocking effect of hydrogen atoms/hydrogen ions by the first metal layer may be prevented from decreasing.

According to the invention above, the thickness of the first metal layer may be compensated by the third metal layer provided between the second metal layer and the first main electrode whereby even when the thickness of the first metal layer becomes thinner at portions, the absorption/blocking effect of the hydrogen atoms/hydrogen ions by the first metal layer may be prevented from decreasing.

According to the invention above, under high-temperature operation, hydrogen atoms/hydrogen ions generated from inside the first main electrode are absorbed/blocked by the first metal beneath the layer first main electrode whereby these hydrogen atoms/hydrogen ions may be prevented from moving to the gate insulating film side and diffusing into gate insulating film. As a result, near the interface of the gate insulating film and the silicon carbide semiconductor portion or in the gate insulating film, the generation of positive charge may be suppressed and variation of the threshold voltage to the negative side when negative voltage is applied to the gate electrode may be suppressed.

According to the invention, the hydrogen atoms/hydrogen ions generated from inside the first main electrode are blocked by the second metal layer between the first metal layer and the first main electrode whereby the movement of the hydrogen atoms/hydrogen ions to the gate insulating film side may be further suppressed. As a result, the variation range of the threshold voltage when negative voltage is applied to the gate electrode may be further reduced.

The silicon carbide semiconductor device and the method of manufacturing a silicon carbide semiconductor device according to the present invention achieve an effect in that predetermined electrical characteristics may be stably obtained and reliability may be improved.

As described, the silicon carbide semiconductor device and the method of manufacturing a silicon carbide semiconductor device according to the present invention is useful for power semiconductor devices used in power supply devices for switching and inverters.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor structure;
an insulated gate structure including
  a gate insulating film, which is a silicon dioxide film, contacting the silicon carbide semiconductor structure, and
  a gate electrode formed on the gate insulating film;
an interlayer insulating film covering the insulated gate structure;
a metal layer provided on the interlayer insulating film for absorbing or blocking hydrogen;
a main electrode provided on the metal layer and electrically connected to the silicon carbide semiconductor structure, and
an alloy film provided between the metal layer and the main electrode, the alloy film containing titanium and aluminum.

2. The silicon carbide semiconductor device according to claim 1, wherein the metal layer is a titanium film.

3. The silicon carbide semiconductor device according to claim 1, wherein the metal layer covers an entire top surface of the interlayer insulating film.

4. The silicon carbide semiconductor device according to claim 1, wherein the interlayer insulating film covers the insulated gate structure and contacts the gate insulating film.

5. The silicon carbide semiconductor device according to claim 1, wherein the main electrode is free of direct contact with the interlayer insulating film and the gate insulating film.

6. The silicon carbide semiconductor device according to claim 1, wherein a thickness of the metal layer is 10 nm to 1.0 μm.

7. The silicon carbide semiconductor device according to claim 1, wherein the metal layer has an absorbed hydrogen molecule concentration of $1\times10^{16}/cm^2$ or higher.

8. The silicon carbide semiconductor device according to claim 1, wherein
the metal layer is a first metal layer, and
the silicon carbide semiconductor device further includes
  a second metal layer provided between the first metal layer and the main electrode, the second metal layer being chemically stable with respect to the first metal layer.

9. The silicon carbide semiconductor device according to claim 1, wherein a thickness of the alloy film is 10 nm to 50 nm.

10. The silicon carbide semiconductor device according to claim 1, wherein
the main electrode is a first main electrode;
the silicon carbide semiconductor device further includes
  a silicon carbide semiconductor substrate, and
  an n-type drift layer and a second main electrode respectively provided on two opposite surfaces of the silicon carbide semiconductor substrate;
the silicon carbide semiconductor structure includes
  a p-type semiconductor region selectively formed in the n-type drift layer, and
  an n-type semiconductor region selectively provided in the p-type semiconductor region;
the gate insulating film covers a surface of a portion of the p-type semiconductor region between the n-type drift layer and the n-type semiconductor region; and
the first main electrode is electrically connected to the n-type semiconductor region.

11. The silicon carbide semiconductor device according to claim 6, wherein the thickness of the metal layer is 80 nm to 150 nm.

12. The silicon carbide semiconductor device according to claim 8, further comprising
a third metal layer, provided between the second metal layer and the main electrode, for absorbing or blocking the hydrogen.

13. The silicon carbide semiconductor device according to claim 12, wherein the third metal layer is a titanium film.

14. The silicon carbide semiconductor device according to claim 12, further comprising
an alloy film provided between the third metal layer and the main electrode, the alloy film containing titanium and aluminum.

15. The silicon carbide semiconductor device according to claim 10, wherein the silicon carbide semiconductor substrate is of an n-type and has an impurity concentration that is higher than that of the n-type drift layer.

16. A silicon carbide semiconductor device comprising:
a silicon carbide semiconductor structure;
an insulated gate structure including
  a gate insulating film, which is a silicon dioxide film, contacting the silicon carbide semiconductor structure, and
  a gate electrode formed on the gate insulating film;
an interlayer insulating film covering the insulated gate structure;
a metal layer provided on the interlayer insulating film for absorbing or blocking hydrogen; and
a main electrode provided on the metal layer and electrically connected to the silicon carbide semiconductor structure, wherein
the metal layer is a first metal layer, and
the silicon carbide semiconductor device further includes
  a second metal layer provided between the first metal layer and the main electrode, the second metal layer being a titanium nitride film and being chemically stable with respect to the first metal layer.

17. A method of manufacturing a silicon carbide semiconductor device, comprising:

providing a silicon carbide semiconductor base having a silicon carbide semiconductor structure formed thereon;

forming an insulated gate structure, including
- thermally oxidizing the silicon carbide semiconductor structure to form a silicon dioxide film on a surface thereof, and
- forming a gate electrode on the silicon dioxide film;

forming an interlayer insulating film covering the insulated gate structure;

forming a titanium film on the interlayer insulating film;

forming an alloy film on the titanium film, the alloy film containing titanium and aluminum; and forming on the alloy film a main electrode that is electrically connected to the silicon carbide semiconductor structure.

18. The method of manufacturing a silicon carbide semiconductor device according to claim 17, comprising performing heat treating at a temperature of 450 degrees C. or less after forming the main electrode.

* * * * *